US009293619B2

(12) United States Patent
Moslehi et al.

(10) Patent No.: US 9,293,619 B2
(45) Date of Patent: Mar. 22, 2016

(54) SMART PHOTOVOLTAIC CELLS AND MODULES

(71) Applicants: Mehrdad M. Moslehi, Los Altos, CA (US); Michael Wingert, Milpitas, CA (US)

(72) Inventors: Mehrdad M. Moslehi, Los Altos, CA (US); Michael Wingert, Milpitas, CA (US)

(73) Assignee: Solexel, Inc., Milpitas, CA (US)

( * ) Notice: Subject to any disclaimer, the term of this patent is extended or adjusted under 35 U.S.C. 154(b) by 364 days.

(21) Appl. No.: 13/682,674

(22) Filed: Nov. 20, 2012

(65) Prior Publication Data

US 2014/0060610 A1    Mar. 6, 2014

Related U.S. Application Data

(60) Provisional application No. 61/561,928, filed on Nov. 20, 2011.

(51) Int. Cl.
*H01L 31/0224* (2006.01)
*H01L 31/05* (2014.01)
(Continued)

(52) U.S. Cl.
CPC ........ *H01L 31/0516* (2013.01); *H01L 27/1421* (2013.01); *H01L 31/02021* (2013.01); *H01L 31/022441* (2013.01); *H01L 31/0504* (2013.01);
(Continued)

(58) Field of Classification Search
CPC ............ H01L 31/02021; H01L 31/042; H01L 31/0504; H01L 27/1421; H01L 31/0519
USPC .......................................... 136/244
See application file for complete search history.

(56) References Cited

U.S. PATENT DOCUMENTS 5,330,583 A    7/1994  Asai et al.
5,867,011 A    2/1999  Jo et al.
(Continued)

FOREIGN PATENT DOCUMENTS

DE        3005560 A1    8/1981
DE    102006052018 A1    5/2008
(Continued)

OTHER PUBLICATIONS

Bypass Diodes in Solar Panels, http://www.electronics-tutorials.ws/diode/bypass-diodes.html, downloaded Jul. 8, 2015.*
(Continued)

Primary Examiner — Jayne Mershon
(74) Attorney, Agent, or Firm — John Wood

(57) ABSTRACT

A back contact solar cell comprises an active semiconductor absorber for use in a back contact solar cell having a light capturing front side and a backside opposite the light capturing front side. A first interdigitated metallization is positioned over the backside of the active semiconductor absorber. The first interdigitated metallization forming base and emitter contact metallization of the back contact solar cell. A backplane is positioned over the backside of the active semiconductor absorber and the first interdigitated metallization. A second interdigitated metallization is positioned over the backplane. The second interdigitated metallization is connected to the first interdigitated metallization for extracting photovoltaic power from the active semiconductor absorber. The second interdigitated metallization has base and emitter busbars over the backplane for electrical connection. An electronic component is electrically connected to at least a base busbar and at least an emitter busbar of the second interdigitated metallization. The electronic component has a bypass switch.

22 Claims, 23 Drawing Sheets

(51) Int. Cl.
*H01L 31/0725* (2012.01)
*H01L 31/02* (2006.01)
*H01L 27/142* (2014.01)
*H02S 40/32* (2014.01)

(52) U.S. Cl.
CPC ............ *H01L 31/0725* (2013.01); *H02S 40/32* (2014.12); *Y02E 10/50* (2013.01)

(56) References Cited

U.S. PATENT DOCUMENTS

| | | | |
|---|---|---|---|
| 5,972,732 | A | 10/1999 | Gee et al. |
| 6,350,944 | B1 | 2/2002 | Sherif et al. |
| 7,759,158 | B2 | 7/2010 | Bachrach et al. |
| 7,839,022 | B2 | 11/2010 | Wolfs |
| 8,093,757 | B2 | 1/2012 | Wolfs |
| 8,427,009 | B2 | 4/2013 | Shaver, II et al. |
| 8,624,436 | B2 | 1/2014 | Willis |
| 8,922,061 | B2 | 12/2014 | Arditi et al. |
| 2003/0121514 | A1 | 7/2003 | Davenport et al. |
| 2004/0021445 | A1 | 2/2004 | Harris |
| 2005/0172995 | A1 | 8/2005 | Rohrig et al. |
| 2006/0290317 | A1 | 12/2006 | McNulty et al. |
| 2007/0113884 | A1 | 5/2007 | Kinsey et al. |
| 2007/0264746 | A1* | 11/2007 | Onishi ............ H01L 31/022441 438/98 |
| 2008/0121272 | A1 | 5/2008 | Besser et al. |
| 2008/0238195 | A1 | 10/2008 | Shaver et al. |
| 2008/0283115 | A1 | 11/2008 | Fukawa et al. |
| 2009/0014050 | A1 | 1/2009 | Haaf |
| 2009/0078300 | A1 | 3/2009 | Ang et al. |
| 2009/0114276 | A1* | 5/2009 | Shan ................ H01L 31/0516 136/256 |
| 2010/0012172 | A1 | 1/2010 | Meakin et al. |
| 2010/0051085 | A1* | 3/2010 | Weidman ........ H01L 31/022441 136/244 |
| 2010/0116325 | A1* | 5/2010 | Nikoonahad ................ 136/251 |
| 2010/0224239 | A1 | 9/2010 | Sharps et al. |
| 2011/0068637 | A1 | 3/2011 | Kiamilev et al. |
| 2011/0079263 | A1* | 4/2011 | Avrutsky ...................... 136/244 |
| 2011/0174355 | A1* | 7/2011 | Biro et al. ..................... 136/244 |
| 2011/0308574 | A1 | 12/2011 | Vaidyanathan |
| 2012/0006380 | A1* | 1/2012 | Mikami et al. ................. 136/244 |
| 2012/0062035 | A1 | 3/2012 | Estibals et al. |
| 2012/0085384 | A1 | 4/2012 | Beitel et al. |
| 2012/0098344 | A1 | 4/2012 | Bergveld et al. |
| 2012/0103402 | A1 | 5/2012 | Kline |
| 2012/0152299 | A1 | 6/2012 | Schultz-Wittmann et al. |
| 2015/0236182 | A1 | 8/2015 | Moslehi |

FOREIGN PATENT DOCUMENTS

| | | | |
|---|---|---|---|
| JP | H05-160425 A | | 6/1993 |
| JP | H07-302923 A | | 11/1995 |
| JP | H11-65687 A | | 3/1999 |
| JP | 2004-047585 A | | 2/2004 |
| JP | 2005-268719 A | | 9/2005 |
| JP | 2008-153429 A | | 7/2008 |
| JP | 2011-096968 A | | 5/2011 |
| WO | WO/2007/044385 | | 4/2007 |
| WO | WO/2009/134939 | | 11/2009 |
| WO | WO 2010/110036 | * | 9/2010 |
| WO | WO/2010/131204 | | 11/2010 |
| WO | WO/2011/106902 | | 9/2011 |
| WO | WO/2011/163437 | | 12/2011 |
| WO | WO/2013/075144 | | 5/2013 |
| WO | WO/2014/169295 | | 10/2014 |

OTHER PUBLICATIONS

PCT International Search Report and Written Opinion dated Mar. 28, 2013 issued in PCT/US2012/066150.
PCT International Preliminary Report on Patentability dated May 20, 2014 issued in PCT/US2012/066150.
PCT International Search Report and Written Opinion dated Sep. 26, 2014 issued in PCT/US2014/034057.
EP Extended Search Report dated Jul. 15, 2015 issued in EP 12850632.6.
PCT International Preliminary Report on Patentability dated Oct. 13, 2015 issued in PCT/US2014/034057.
Kiefer et al. (Jul. 2011) "High Efficiency n-Type Emitter-Wrap-Through Silicon Solar Cells" *IEEE Journal of Photovoltaics*, 1(1): 49-53.

* cited by examiner

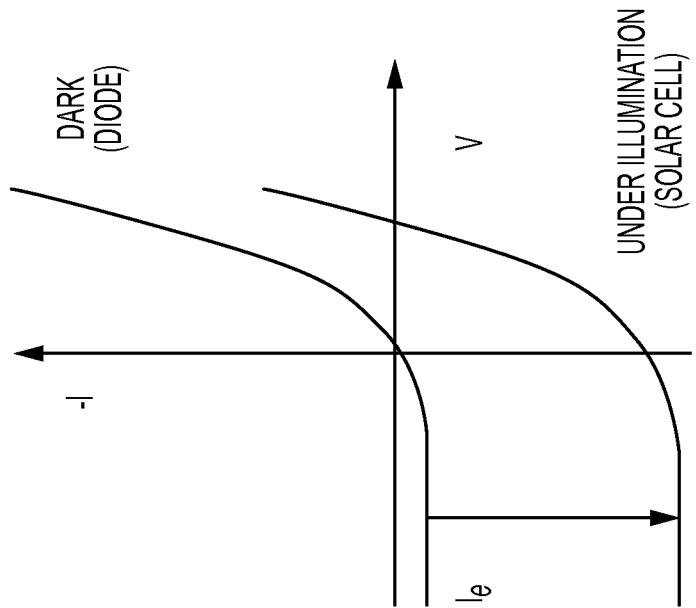
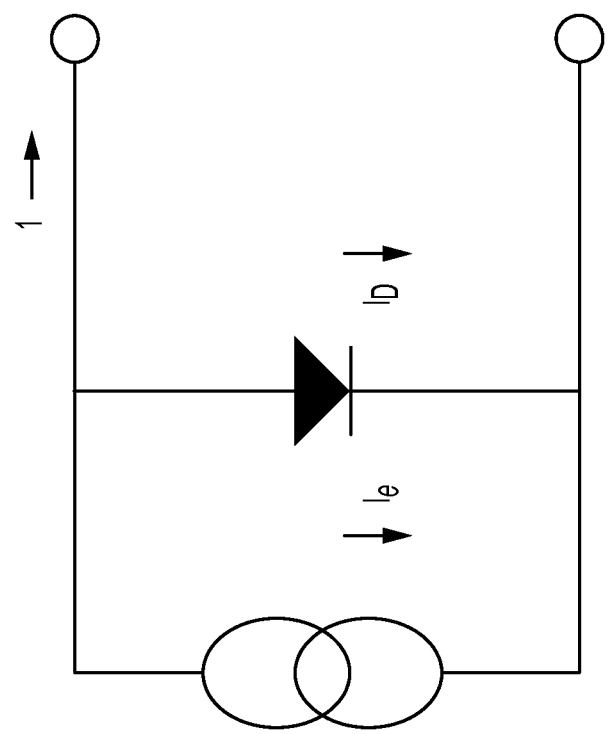
FIG. 2A
FIG. 2B

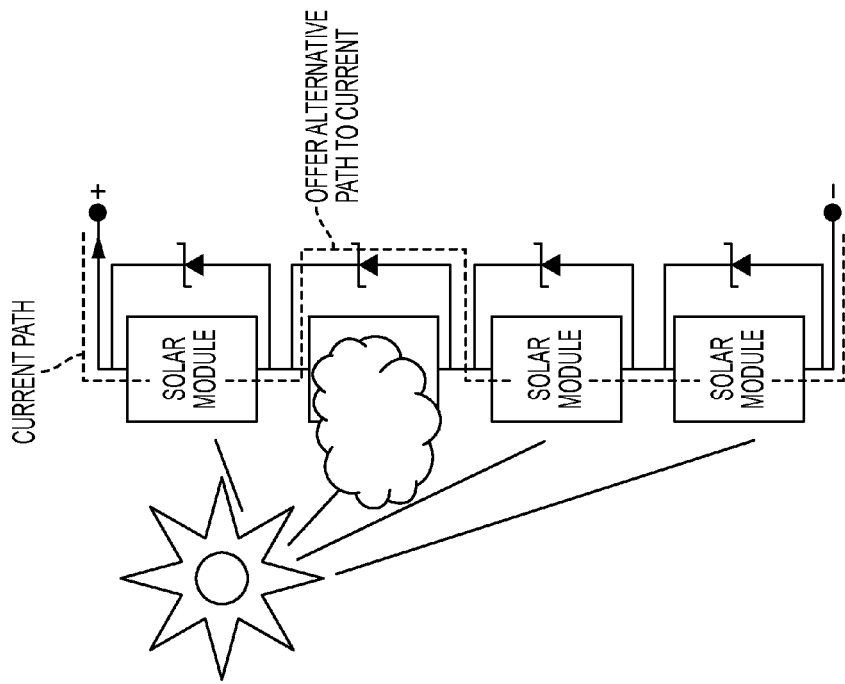
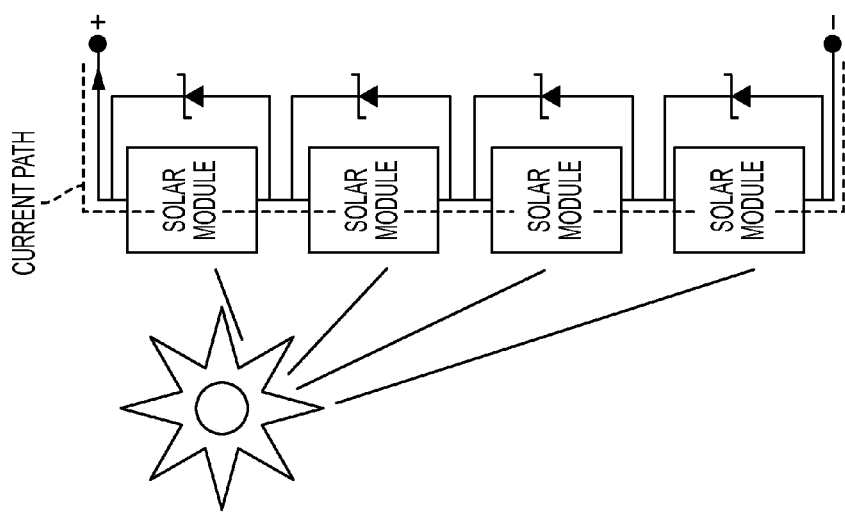

SMART PHOTOVOLTAIC CELLS AND MODULES

CROSS-REFERENCE TO RELATED APPLICATIONS

This application claims the benefit of provisional patent application 61/561,928 filed on Nov. 20, 2011, which is hereby incorporated by reference in its entirety.

FIELD OF THE INVENTION

The present disclosure relates in general to the fields of solar photovoltaic (PV) cells and modules, and more particularly on-cell electronics including power electronics for photovoltaic (PV) solar cells and modules.

BACKGROUND

Crystalline silicon photovoltaic (PV) modules currently, as of 2012, account for approximately over 85% of the overall global PV anneal demand market and cumulative installed capacity. The manufacturing process for crystalline silicon PV is based on the use of crystalline silicon solar cells, starting with mono-crystalline or multi-crystalline silicon wafers. Non-crystalline-silicon-based thin film PV modules (e.g., such as CdTe, CIGS, and amorphous silicon PV modules) may offer the potential for low cost manufacturing process but typically provide much lower conversion efficiencies (in the range of single digit up to about 14%) for commercial thin-film PV modules compared to the mainstream crystalline silicon PV modules (which provide efficiencies in the typical range of 14% to over 20% for commercial crystalline silicon modules), and an unproven long-term track record of field reliability compared to the well-established crystalline silicon solar PV modules. The leading-edge crystalline silicon PV modules offer the best overall energy conversion performance, long-term field reliability, non-toxicity, and life cycle sustainability among various PV technologies. Moreover, recent progress and advancements have already driven the overall manufacturing cost of crystalline silicon PV modules to below $0.80/Wp. Disruptive monocrystalline silicon technologies—such as high-efficiency thin monocrystalline silicon solar cells fabricated based on the use of reusable crystalline silicon templates, thin (e.g., 50 µm) epitaxial silicon, thin silicon support using backplane lamination, and porous silicon lift-off technology—offer the promise of high-efficiency (with solar cell and/or module efficiencies of at least 20%) and PV module manufacturing cost at well below $0.50/Wp at mass manufacturing scale.

FIG. 1A is a schematic showing the equivalent circuit of a typical solar cell, such as a crystalline silicon solar cell or a compound semiconductor such as a GaAs solar cell. A solar cell may be represented as a current source, producing the photo-generation current shown as $I_L$ or also known as short circuit current Isc (the current that flows when the solar cell terminals are shorted), in parallel with a diode, also in parallel with a shunt resistance, and in series with a series resistance. The current produced by the current source depends on the level of sunlight irradiation power intensity on the solar cell. Undesirable dark current $I_D$ flows in the opposite direction of $I_L$ and is produced by recombination losses in the solar cell. Voltage across the solar cell when its terminals are open and not connected to any load is known as Voc or open-circuit voltage. A realistic solar cell equivalent circuit also includes the finite series resistance Rs and the finite shunt resistance $R_{SH}$, as shown in the circuit schematic of FIG. 1B. In an ideal solar cell, the series resistance $R_S$ is zero and the shunt resistance $R_{SH}$ is infinite. However, in actual realistic solar cells, the finite series resistance is due to the fact that a solar cell has parasitic series resistance components in its semiconductor and metallization (i.e., it is not a perfect conductor). Such parasitic resistance components, including semiconductor layer resistance and metallization resistance result in ohmic losses and power dissipation during the solar cell operation. The shunt resistance is caused by the undesirable leakage of current from one terminal to the other due to effects such as areal and edge shunting defects as well as other non-idealities in the solar cell. Again, an ideal solar cell would have a series resistance of zero and a shunt resistance of infinite resistance value.

FIG. 2A is again a schematic showing an equivalent circuit model of a solar cell, showing the current source, photo-generating current, and dark current (but not showing the parasitic series and shunt resistances), and FIG. 2B is a corresponding graph showing the typical current-voltage (IV) characteristics of a solar cell such as a crystalline silicon solar cell, with and without sunlight illumination on the cell. $I_L$ and $I_D$ are the desirable active photo-generated current and the undesirable dark current of the solar cell, respectively.

Solar cells used in PV modules are essentially photo-diodes—they directly convert the sunlight arriving at their surface to electrical power through photo-generated charge carriers in the semiconductor absorber. In a module with a plurality of solar cells, shaded cells cannot produce the same amount of electrical power as the non-shaded cells within the PV module. Since all the cells in a typical PV module are usually connected in series strings, differences in power also cause differences in photo-generated electrical currents through the cells (shaded vs. non-shaded cells). If one attempts to drive the higher current of the series-connected non-shaded cells through a shaded (or partially shaded) cell which is also connected in series with the non-shaded cells, the voltage of the shaded cell (or partially shaded cell) actually becomes negative (i.e., the shaded cell effectively becomes reverse biased). Under this reverse bias condition the shaded cell is consuming or dissipating significant power instead of producing power. The power consumed and dissipated by the shaded or partially shaded cell will cause the cell to heat up, creating a localized hot spot where the shaded cell is located, and eventually possibly causing cell and module failure, hence creating major reliability failure problems in the field.

A standard (i.e., typically a PV module comprising 60 solar cells) crystalline silicon PV module is typically wired into three 20-cell series-connected strings within the module, each protected by an external bypass diode (typically either a pn junction diode or a Schottky diode) placed in an external junction box which are electrically connected in series to each other to form the final PV module assembly electrical interconnections and the output electrical leads of the series-connected module. As long as the PV module receives relatively uniform solar irradiation on its surface, the cells within the module will produce nearly equal amounts of power (and electrical current), with a cell maximum-power voltage or $V_{mp}$ on the order of approximately ~0.5 V to 0.6 V for most typical crystalline silicon PV modules. Hence, the maximum-power voltage or $V_{mp}$ across each strong of 20 cells connected in series will be approximately on the order of 10 to 12 V for a PV module using crystalline silicon cells. Under the uniform module illumination condition, each external bypass diode will have about −10 to −12 V reverse bias voltage across its terminals (while the module operates at its maximum-power point or MPP) and the bypass diode remains in the OFF state (hence, there no impact on the module power output by the reverse biased external bypass diodes in the junction box). In the case where a cell in a 20-cell string is partially or fully shaded, it produces less electrical power (and less current) than the non-shaded cells. Since the cells in the string are usually connected in series, the shaded solar cell becomes reverse biased and starts to dissipate electrical power, and therefore would create localized hot spot at the location of the reverse-biased shaded cell instead of producing power. Unless appropriate precautions are taken, the power dissipation and the resulting localized heating of the shaded cell may result in poor cell and module reliability due to various failure modes (such as failure of the reverse-biased shaded cell, failure of cell-to-cell interconnections, and/or failure of the module lamination materials such as the encapsulant and/or backsheet), as well as potential fire hazards in the installed PV systems.

Crystalline silicon modules often use external bypass diodes in order to eliminate the above-mentioned hot-spot effects caused by the partial or full shading of cells and to prevent the resulting potential module reliability failures. Such hot-spot phenomena, which are caused by reverse biasing of the shaded cells, may permanently damage the affected PV cells and even cause fire hazards if the sunlight arriving at the surface of the PV cells in a PV module is not sufficiently uniform (for instance, due to full or even partial shading of one or more cells). Bypass diodes are usually placed on sub-strings of the PV module, typically one external bypass diode per sub-string of 20 solar cells in a standard 60-cell crystalline silicon solar module with three 20-cell sub-strings (this configuration may be one external bypass diode per sub-string of 24 solar cells in a 72-cell crystalline silicon solar module with three 24-cell sub-strings; many other configurations are possible for modules with any number of cells). This connection configuration with external bypass diodes across the series-connected cell strings prevents the reverse bias hot spots and enables the PV modules to operate with high reliability throughout their lifetime under various real life shading or partial shading and soling conditions. In the absence of cell shading, each cell in the string acts as a current source with relatively matched current values with the other cells in the string, with the external bypass diode in the sub-string being reversed biased with the total voltage of the sub-string in the module (e.g., 20 cells in series create approximately about 10V to 12 volt reverse bias across the bypass diode in a crystalline silicon PV system). With shading of a cell in a string, the shaded cell is reverse biased, turning on the bypass diode for the sub-string containing the shaded cell, thereby allowing the current from the good solar cells in the non-shaded sub-strings to flow in the external bypass circuit. While the external bypass diodes (typically three external bypass diodes included in the standard mainstream 60-cell crystalline silicon PV module junction box) protect the PV module and cells in case of shading of the cells, they can also actually result in significant loss of power harvesting and energy yield for the installed PV systems.

FIGS. 3A and 3B are diagrams of representative 60-cell crystalline silicon solar module with three 20-cell sub-strings 2 (with 20 cells in each sub-string connected in series) connected in series, and three external bypass diodes 4 to protect the cells during shading or excessive partial shading of any cells in the module (FIG. 3A shows single-cell shading, shaded cell 6, and FIG. 3B shows multi-cell partial shading conditions, partially shaded row 8). As an example, FIG. 3A shows a 60-cell module with one shaded cell in the bottom row (one 20-cell sub-string affected by shading) and FIG. 3B shows a 60-cell module with six partially shaded cells in the bottom row (three 20-cell sub-strings affected by shading). If one or more cells are shaded (or partially shaded to a significant degree of shading) in a sub-string (as shown in FIG. 3A), the bypass diode for the sub-string with the shaded cell(s) is activated and shunts the entire sub-string, thus both protecting the shaded cell(s) by preventing the hot spots and also reducing the effective module power output by about ⅓ (if only one sub-string out of three is affected by shading). If at least one cell per sub-string is shaded (as shown in FIG. 3B), all three bypass diodes are activated and shunt the entire module, thus preventing extraction of any power from the module when there is at least one shaded cell in each of the three 20-cell sub-strings.

As an example, a typical external PV module junction box may house three external bypass diodes in a 60-cell crystalline silicon solar module. The external junction box and related external bypass diodes contribute to a portion of the overall PV module Bill of Materials (BOM) cost and may contribute about 10% of the PV module BOM cost (i.e., as a percentage of the PV Module BOM cost excluding the cost of solar cells). Moreover, the external junction box may also be a source of field reliability failures and fire hazards in the installed PV systems. While most current crystalline silicon PV modules predominantly use external junction boxes with external bypass diodes placed in the junction box, there have been some examples of PV modules with front-contact cells placing and laminating the three bypass diodes directly within the PV module assembly, but separate from the front-contact solar cells, during the module lamination process (however, still using one bypass diode per 20-cell sub-string of front-contact cells). This example still has the limitations of external bypass diodes, i.e., even when a single cell is shaded the bypass diode shunts the entire substring of cells with the shaded cell within the sub-string thus reducing the power harvesting and energy yield capability of the installed PV system.

One known method to minimize the reliability failure effects of shading on a module in a series string of modules is to use bypass diodes across modules connected in series, the effect of which is shown in FIGS. 4A and 4B and an example circuit is depicted in FIG. 5. This is in effect the same as the modules with external bypass diodes within each module junction box. FIG. 4A shows a non-shaded current path for a solar cell module series and FIG. 4B shows the same solar cell module series with one module shaded and a bypass diode providing an alternative current path. And FIG. 5 is a schematic circuit model diagram of series-connected solar cells with an external bypass diode used in a module sub-string or string (each solar cell shown with its equivalent circuit diagram). If none of the cells are shaded, the bypass diode remains in the reverse bias state and the solar cell string operates normally, contributing fully to the solar module power generation. If any of the cells are partially or fully shaded, the shaded cell is reverse biased and the bypass diode is forward biased, hence minimizing the possibility of a hot spot or damage to the shaded cell. In other words, when a module becomes shaded its bypass diode becomes forward biased and conducts current preventing performance degradation and reliability problems in the series string of modules. The bypass diode holds the voltage of the entire shaded module (or a sub-string with at least one shaded cell) to a small negative voltage (e.g., −0.5V to 0.7V) limiting overall power reduction in the module string array output.

FIG. 6 is a graph showing the current-voltage (I-V) characteristics of a crystalline solar cell with and without a bypass diode (example shown with a pn junction bypass diode). The bypass diode limits the maximum reverse bias voltage applied across a shaded solar cell to no more than the turn-on forward bias voltage of the bypass diode.

FIG. 7 is a diagram showing an example of a crystalline silicon PV module similar to that of FIGS. 4 and 5 with one shaded cell per 20-cell sub-string within a 60-cell module (such as shaded cell 10, three cells are shaded total) wherein the three shaded cells in the three 20-cell sub-strings result in the elimination of solar PV power provided by the module since all three 20-cell sub-strings are shunted by the bypass diodes to protect the shaded cells. Using an arrangement of one external bypass diode per 20-cell sub-string, the result of having three shaded cells in the three 20-cell sub-strings is that the power extracted from the PV module drops to zero even though only 3/60 of the module (or 3 out of 60 cells) is affected by shading. Again, this type of known PV module arrangement with external bypass diodes results in significant energy yield and power harvesting penalty for the installed PV systems in the field.

In crystalline silicon PV system installations with multiple module strings, the module shading effects and their detrimental impact on power harvesting and energy yield may be much larger than the examples shown above with a single series string of modules. In PV systems with multiple parallel strings of series connected module strings, the parallel strings must produce approximately the same voltage as one another (i.e., the voltages of parallel strings must be matched). As a result, the electrical constraint of having all module strings connected in parallel operating at approximately the same voltage does not allow a shaded string to activate its bypass diodes. Therefore, in many cases, shade on PV modules in one of the strings may actually reduce the power produced by the entire string. As a representative example, consider one non-shaded PV module string and one PV module string that is shaded as described in the previous example above. A Maximum-Power-Point-Tracking (MPPT) capability will enable the production of full power from the first PV module string and the production of, for example, 70% of full power from the second PV module string. In this way, both strings reach the same voltage (the currents from the parallel strings are additive at the same module string voltage for the parallel connected strings of series-connected modules). Therefore, in this example and using a centralized DC-to-AC inverter with centralized MPPT, the power produced by the PV module array would be 85% of the maximum possible power without any module shading.

FIGS. 8 and 9 are diagrams showing two examples of PV system installations. FIG. 8 shows example of a 3×6 array of PV modules (each with 50 W output) with bypass diodes connected to produce 600 V, 900 W PV output. FIG. 9 shows a series connection of three PV modules with bypass diodes and a blocking diode along with a charging battery. In conventional modules, module strings connected in series and in parallel may typically use bypass and blocking diodes. However, similar to previously described examples, these representative PV module installations suffer from the power harvesting limitation and reduced energy yield of the installed PV system due to the problems outlined earlier.

A representative example of the monolithic integration of a bypass diode with a front-contact, compound semiconductor (III-V), multi-junction solar cell for Concentrator PV (or CPV) applications is shown in FIG. 10. FIG. 10 is a diagram showing an example of monolithic integration of a bypass diode with a multi-junction compound semiconductor CPV cell. This example shows a compound semiconductor Schottky diode used as monolithically integrated bypass diode on the same germanium (Ge) substrate as a compound semiconductor, multi-junction solar cell for CPV applications. In this example, the Schottky bypass diode and the compound semiconductor, multi-junction solar cell are both on the same side (top side) of the solar cell, and have different material layer stacks, thereby making the solar cell fabrication process much more complicated and costly (hence, such embodiments only demonstrated for the CPV application in which the CPV cells are quite expensive). As a result of monolithic integration of the Schottky bypass diode with the solar cell on the same expensive germanium substrate, the overall process complexity and cost are substantially and further increased while incurring an effective solar cell and solar panel efficiency penalty due to the integration of the Schottky bypass diode on the same side as the active sunnyside of the cell. This monolithic integration of the bypass Schottky diode on a front-contact compound semiconductor multi-junction solar cell requires different stacks of material layers in the solar cell and in the bypass switch, hence substantially complicating the overall monolithic solar cell processing, increasing the number of solar cell fabrication process steps, and raising its manufacturing cost. While such significant added processing complexity and cost increase for fabrication of the solar cell may be acceptable in a CPV solar cell, it cannot be economically viable in a not very high concentration CPV solar cell, for example such as in crystalline silicon solar cells. FIG. 11 is a diagram showing an example of monolithic integration of a bypass diode with a multi-junction compound semiconductor CPV cell. This example shows a pn junction diode used as monolithically integrated bypass diode on the same germanium (Ge) substrate as a compound semiconductor, multi-junction solar cell. In this example, the pn junction bypass diode and the compound semiconductor, multi-junction solar cell are both on the same side (top side) of the solar cell and have different material stacks—thereby making the solar cell fabrication process much more complicated and costly (hence, such embodiment only demonstrated for the CPV application in which the CPV cells are quite expensive). As a result of monolithic integration of the pn junction bypass diode with the solar cell on the same expensive germanium substrate, the overall process complexity and cost are further increased while incurring an effective solar cell and solar panel efficiency penalty due to the integration of the bypass diode on the same side as the active sunnyside of the cell. Again, this monolithic integration of the bypass pn junction diode on a front-contact compound semiconductor multi-junction solar cell requires different stacks of material layers in the solar cell and in the bypass switch—hence substantially complicating the overall monolithic solar cell processing, increasing the number of solar cell fabrication process steps, and raising its manufacturing cost. While such significant added processing complexity and cost increase for fabrication of the solar cell may be acceptable in a CPV solar cell, it cannot be economically viable in a not very high concentration CPV solar cell, for example such as in crystalline silicon solar cells.

In general, while the monolithic integration of the bypass diode (Schottky diode or pn junction diode) as shown on an expensive multi-junction solar cell for very high concentration CPV applications may be acceptable for that particular application despite the extra cost and added manufacturing process complexity of the monolithic integration with the solar cell, the approaches demonstrated for the expensive compound semiconductor multi-junction solar cells would be prohibitively too expensive and not acceptable for mainstream flat-panel (non-concentrating or low to medium concentration) solar PV cells and modules. Also, as noted previously, because the method of monolithic integration of the bypass diode consumes area otherwise used by the solar cell it reduces the effective sunlight absorption and hence the effective cell efficiency due to loss of sunlight absorption area.

Various solutions have been attempted to provide power harvesting and energy yield enhancement capability as compared to the more conventional capabilities of module-level DC-to-AC micro-inverter power optimizer or module-level DC-to-DC converter power optimizer. One such technology utilizes programmable interconnects between the cells within the module in order to increase the energy yield of the cell-based PV module, for example Adaptive Solar Module (ASM) technology from Emphasis Energy. In some instances, this may enable a higher level of PV energy harvesting in the case of module shading compared to more traditional MPPT power optimizers. However, this technology utilizes a module level/external converter box (micro-inverter or DC-to-DC converter) and associated interconnects technology which may cost around $30 to over $100 per PV module. The module level converter box provides energy conversion from DC-to-DC or from DC-to-AC and may be built into the PV module assembly to provide reconfigurable or programmable cell interconnections within the module. However, the module level converter box is not and cannot be integrated with the individual cells, such as on cell backsides, and assembled with the individual cells.

BRIEF SUMMARY OF THE INVENTION

Therefore, a need has arisen for back contact solar cells having electronics that provide increased power harvesting and energy yield improvements. In accordance with the disclosed subject matter, a back contact solar cell with electronics is provided which substantially eliminates or reduces disadvantages associated with previously developed back contact solar cells and back contact solar cell modules.

According to one aspect of the disclosed subject matter, a back contact solar cell comprises an active semiconductor absorber for use in a back contact solar cell having a light capturing front side and a backside opposite the light capturing front side. A first interdigitated metallization is positioned over the backside of the active semiconductor absorber. The first interdigitated metallization forming base and emitter contact metallization of the back contact solar cell. A backplane is positioned over the backside of the active semiconductor absorber and the first interdigitated metallization. A second interdigitated metallization is positioned over the backplane. The second interdigitated metallization is connected to the first interdigitated metallization for extracting photovoltaic power from the active semiconductor absorber. The second interdigitated metallization has base and emitter busbars over the backplane for electrical connection. An electronic component is electrically connected to at least a base busbar and at least an emitter busbar of the second interdigitated metallization. The electronic component has a bypass switch.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages that are included within this description, be within the scope of any claims.

BRIEF DESCRIPTION OF THE DRAWINGS

The features, natures, and advantages of the disclosed subject matter may become more apparent from the detailed description set forth below when taken in conjunction with the drawings in which like reference numerals indicate like features and wherein:

FIG. 2A is a schematic showing an equivalent circuit model of an ideal solar cell (no series or shunt resistances shown) and FIG. 2B is a corresponding graph showing the current-voltage (IV) characteristics of a solar cell under dark and sunlight illumination conditions;

FIG. 4A is a diagram showing a non-shaded current path for a solar cell module series and FIG. 4B is a diagram showing the same solar cell module series with one module shaded and a bypass diode providing an alternative bypass current path;

DETAILED DESCRIPTION

Figure 1A:
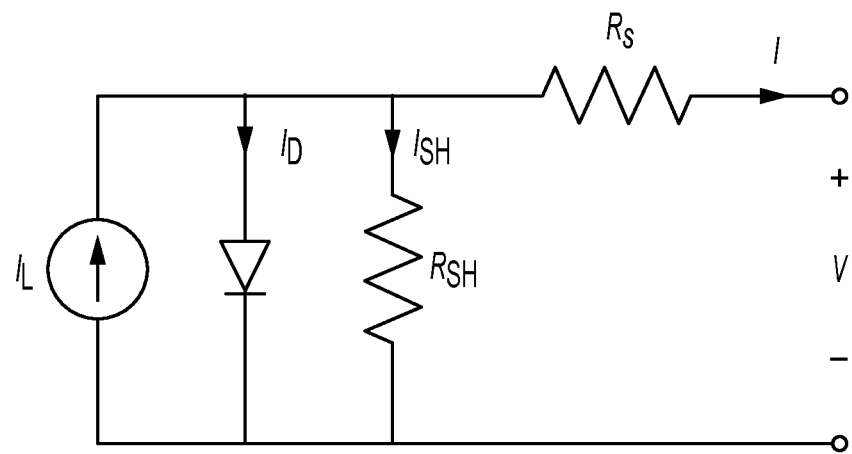
FIGS. 1A and 1B are circuit schematics showing the equivalent circuit diagram for a solar PV cell.
Figure 1B:
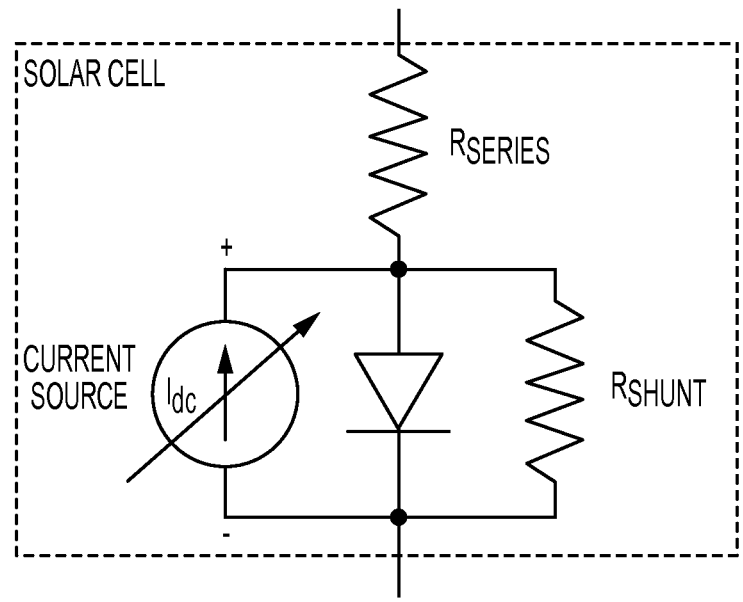
Figure 3B:
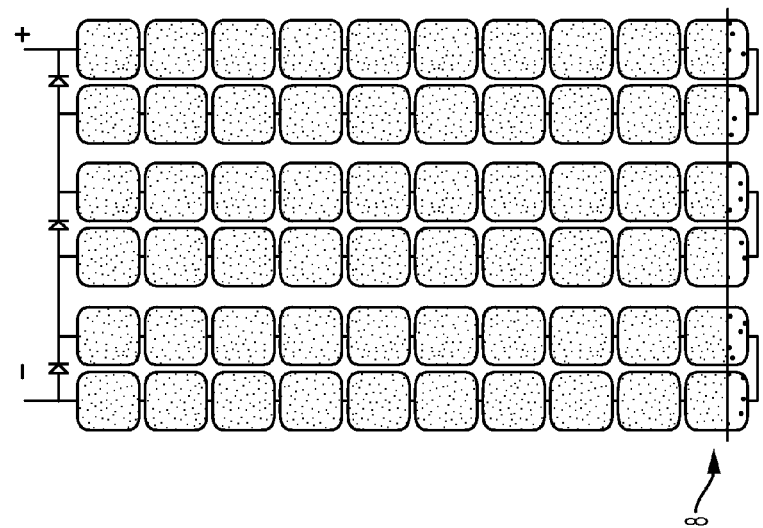
FIGS. 3A and 3B are diagrams of a typical 60-cell crystalline silicon solar module with one shaded and several partially shaded cells, respectively.
Figure 3A:
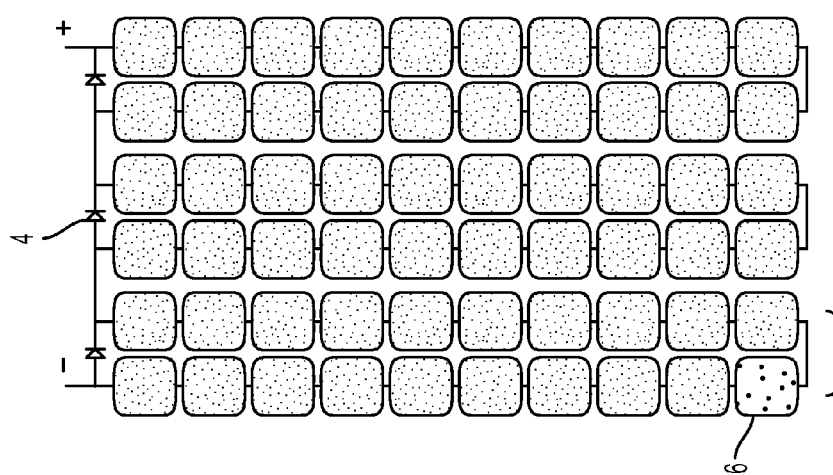
Figure 5:
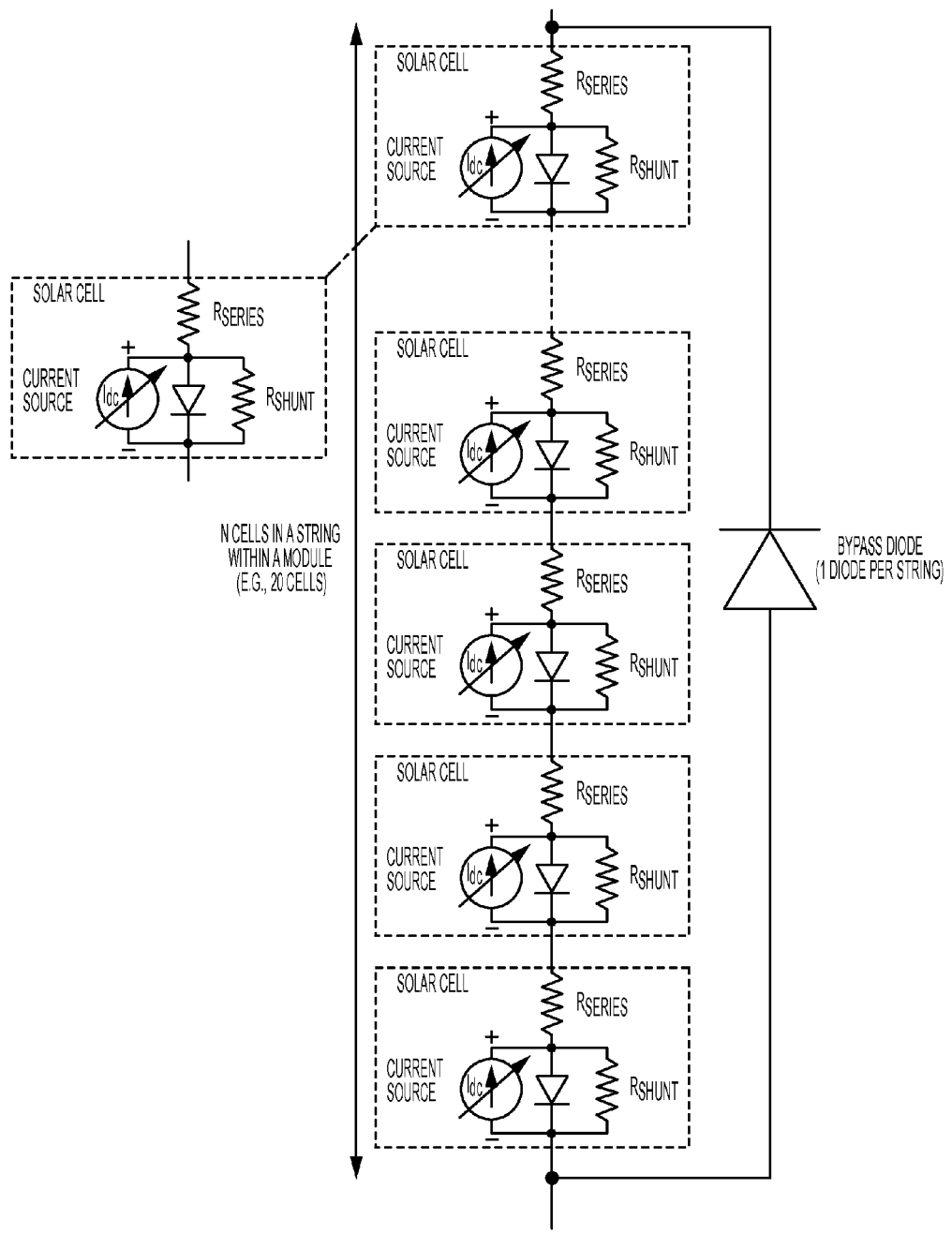
FIG. 5 is a schematic diagram of an external bypass diode used in a module sub-string, with the solar cells shown with their equivalent circuit diagrams.
Figure 6:
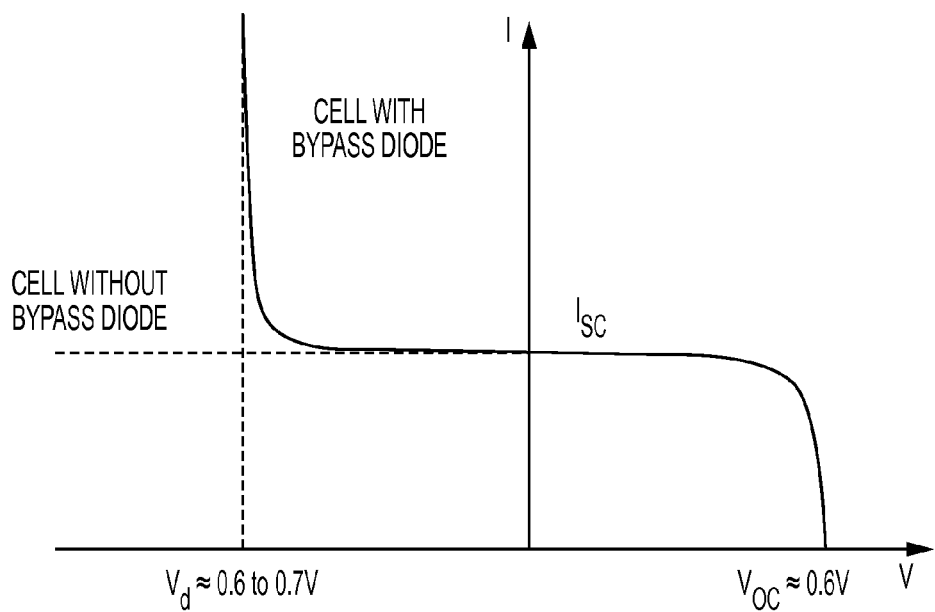
FIG. 6 is a graph showing the current-voltage (I-V) characteristics of a crystalline solar cell with and without a bypass diode.

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

And although the present disclosure is described with reference to specific embodiments, such as back contact solar cells using monocrystalline silicon substrates and other described fabrication materials, one skilled in the art could apply the principles discussed herein to front contact cells, other materials including semiconductor materials (such as gallium arsenide, germanium, etc.), technical areas, and/or embodiments without undue experimentation.

As noted and described above, current state-of-the-art solar cell protection and hot spot prevention providing reliable module operation in presence of shading as well as maximum power extraction solutions in known crystalline silicon (or other cell-based) PV systems are often based on using one or a combination of the following: bypass diodes, most commonly one external bypass diode per one substring of series-connected solar cells in a PV module (typically three external bypass diodes are placed in an external module junction box per crystalline silicon PV module); maximum power point tracking (MPPT) at the module level using external one external micro-inverter (or alternatively one DC-to-DC converter) per PV module; and, programmable interconnect technology between the cells within the module in order to increase the energy yield of the cell-based PV module.

Figure 7:
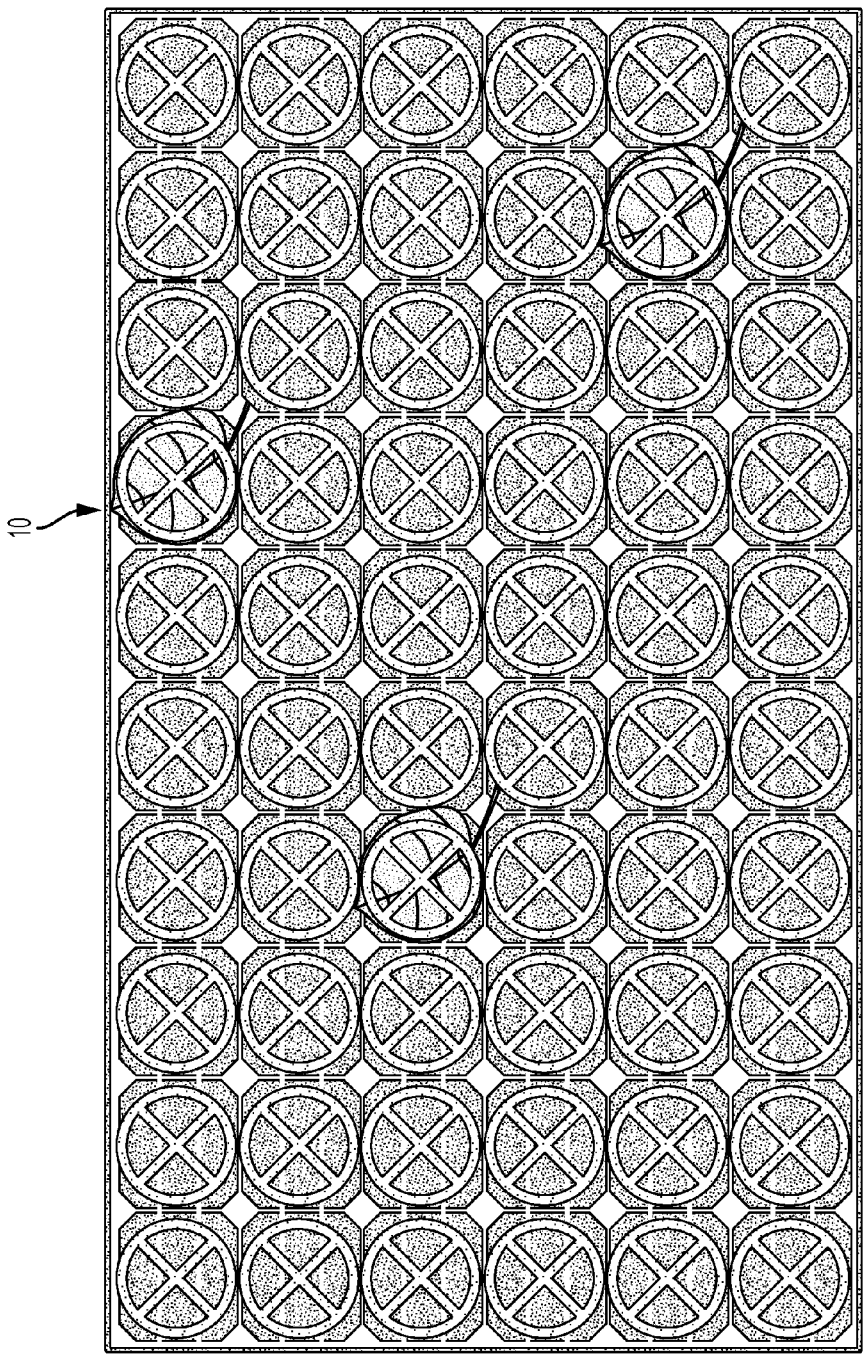
FIG. 7 is a diagram showing an example of a crystalline silicon PV module with three shaded cells on different sub-strings of the series-connected solar cells.
Figure 8:
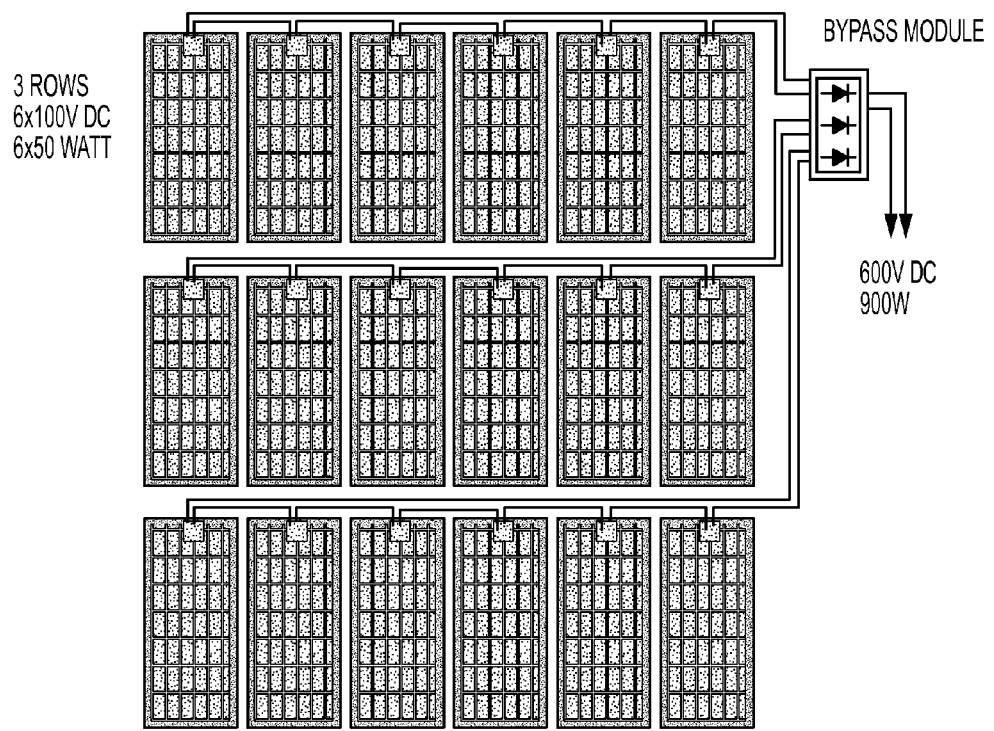
FIGS. 8 and 9 are diagrams showing two examples of PV system installations.
Figure 9:
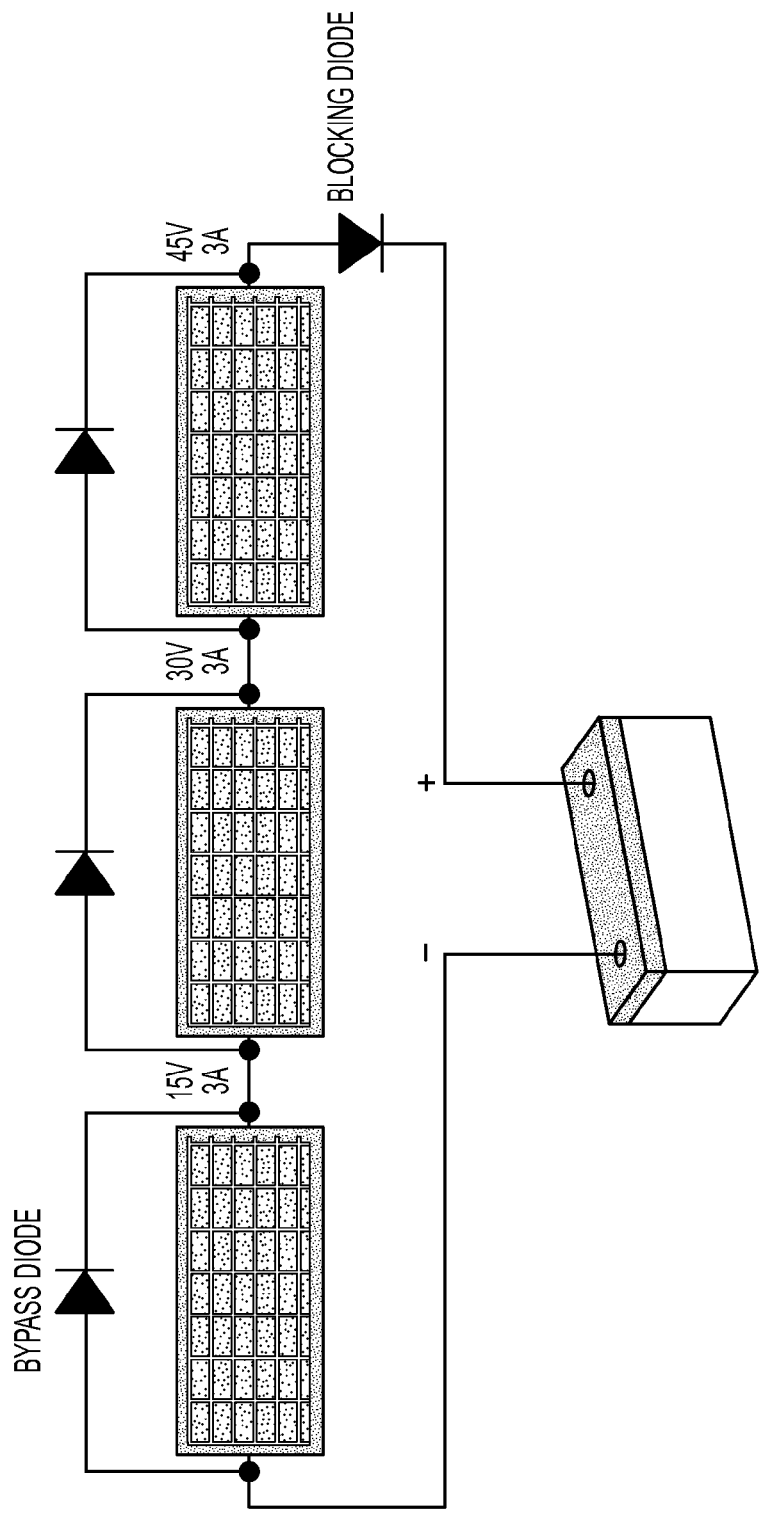
Figure 10:
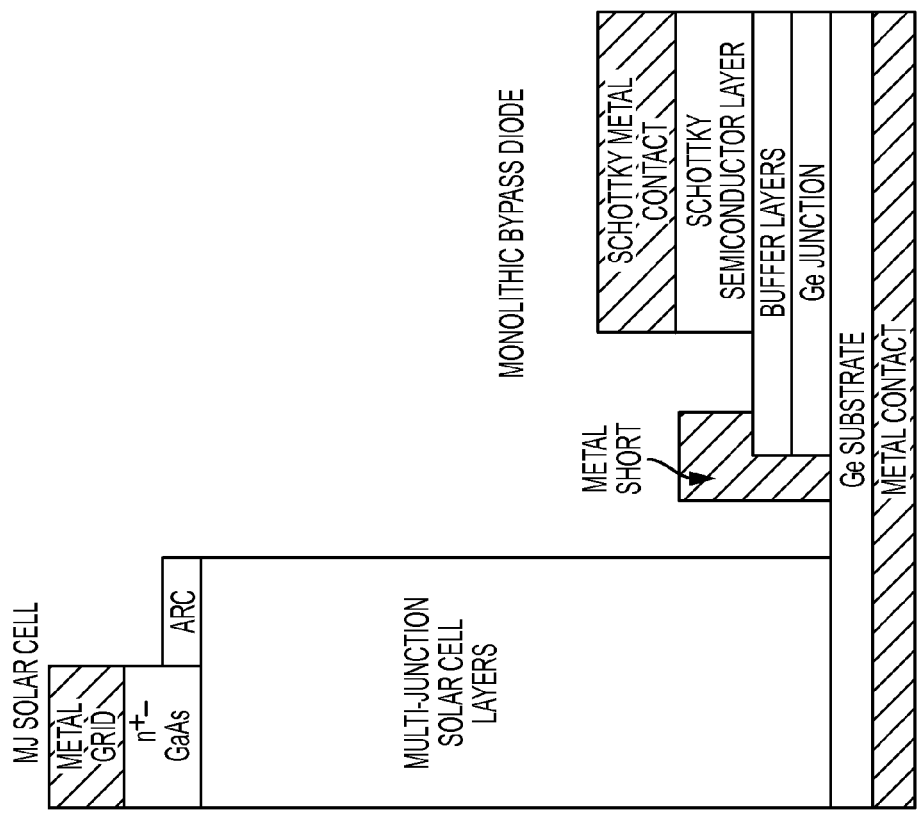
FIGS. 10 and 11 are diagrams showing examples of monolithic integration of a bypass diode (either Schottky diode or pn junction diode) with a multi-junction compound semiconductor CPV cell.
Figure 11:
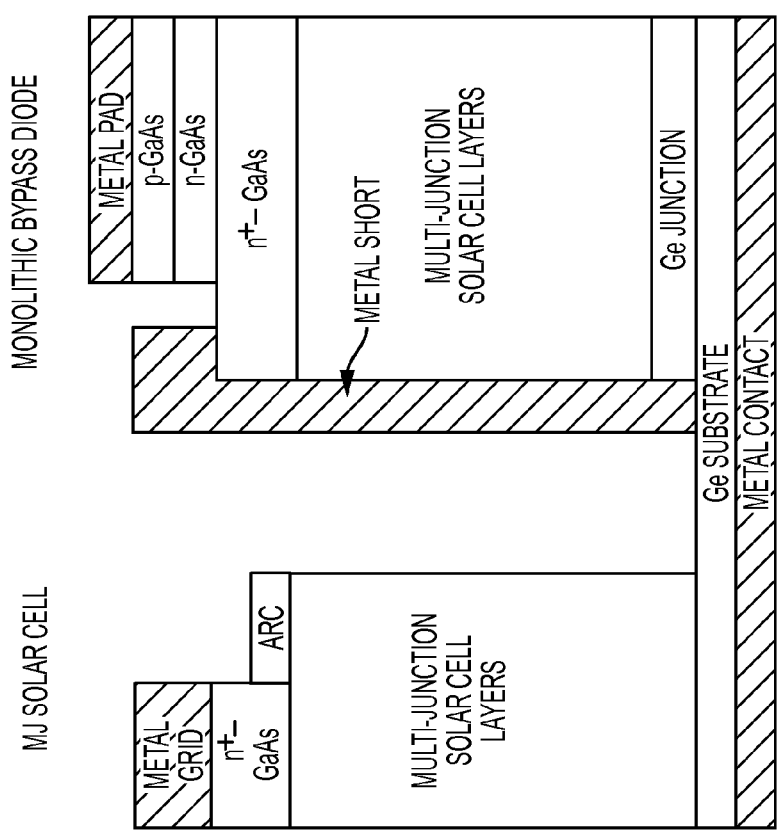

While bypass diodes may protect shaded cells, prevent hot spots, and prevent module failures due to hot spots and reverse biased cells, they also result in significant energy yield reduction due to module power extraction losses in realistic field operations when module shading or soling is present. For instance, a single shaded cell can result in loss of ⅓ of the module power (since the bypass diode would bypass the entire 20-cell sub-string containing the shaded cell) while the single cell accounts for only 1/60 of the module power during normal non-shaded conditions, assuming a standard 60-cell module design. Similarly, with three shaded cells, assuming one shaded cell per 20-cell sub-string in a 60-cell PV module (an example of which is shown in FIG. 7), all three bypass diodes are activated and the power extracted from the module drops to zero (or 100% loss of module power) while the three shaded cells account for only 3/60 (1/20) of the module power during normal non-shaded operating conditions.

In contrast, the solutions disclosed herein provide smart PV cells and smart PV modules which comprise, for example, the following components or a combination of the following components to increase PV module power harvesting and increase energy yield for PV installations as well as other associated benefits. A distributed shade management solution having a bypass switch mounted onto and integrated on the backside (for example on the cell backplane) of each solar cell and laminated/embedded within the module assembly—thus eliminating the need for the external junction box with external bypass diodes and also increasing overall module reliability. A distributed power optimizer and energy yield enhancement solution which integrates one DC-to-DC converter power optimizer or one DC-to-AC micro-inverter power optimizer onto each solar cell backside (for example on the cell backplane). The cell-level power optimizer electronics (for example a monolithic single-chip solution) may be mounted onto and integrated on the backside backplane of the back-contact solar cell and laminated/embedded within the module assembly. In the various power optimizer embodiments disclosed, the power extracted from each cell may be maximized despite shading conditions and a distributed shade management solution obtained.

The disclosed systems and methods provide smart PV cells and smart PV modules with the capability of integrating very low-cost distributed cell-level (cellular) power electronics, reducing system cost (enabling installed system cost of <$1/W installed) and improving performance in terms of energy yield (enabling <$0.05-$0.10/kWh Levelized Cost of Electricity or LCOE). Cost and efficiency play key roles in solar cell manufacturing and, as noted earlier, crystalline silicon photovoltaic (PV) modules currently account for over 85% of the overall global PV market. Currently, the starting silicon wafer cost accounts for approximately 40% of the crystalline silicon PV module manufacturing cost.

Figure 12:
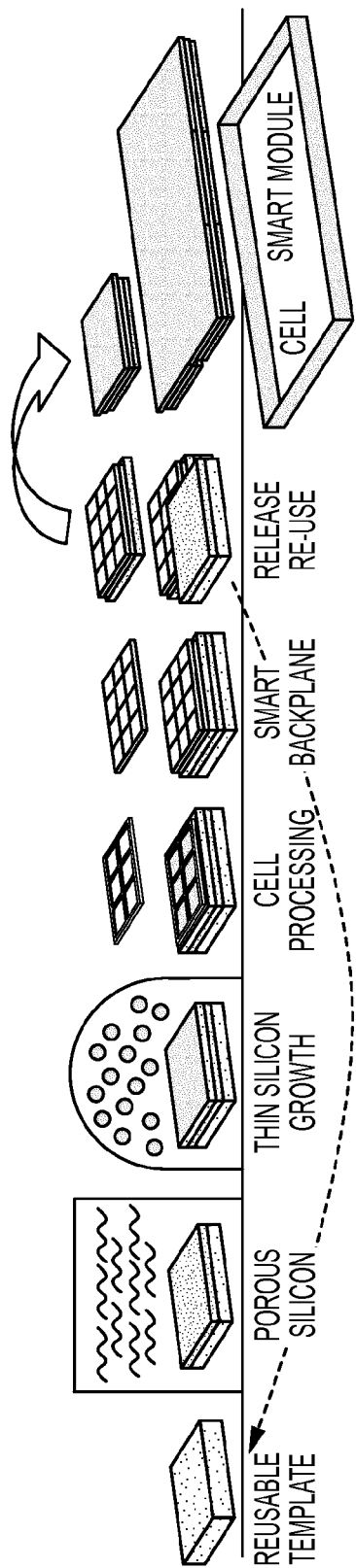
FIG. 12 is a process flow highlighting key processing steps of a thin-silicon, back-contact/back-junction crystalline silicon solar cell manufacturing process.

FIG. 12 is a process flow highlighting key processing steps of a thin-crystalline-silicon solar cell manufacturing process which substantially reduces silicon usage and eliminates traditional manufacturing steps to create low-cost, high-efficiency, back-junction/back-contact monocrystalline cells with laminated backplanes for smart cells and smart modules, using a reusable template and epitaxial silicon deposition on a release layer of porous silicon. The smart cell includes at least one or a combination of electronic components (such as bypass switch and/or a DC-to-DC or DC-to-AC MPPT power optimizer directly mounted on and attached onto the backplane).

The process starts with a reusable silicon template (typically made of a p-type monocrystalline silicon wafer) onto which a thin sacrificial layer of porous silicon is formed (for example by an electrochemical etch process through a surface modification process in an HF/IPA wet chemistry in presence of an electrical current). Upon formation of the sacrificial porous silicon layer, which serves both as a high-quality epitaxial seed layer as well as a subsequent separation/lift-off layer, a thin (typically with a thickness in the range of a few microns up to about 70 microns, most preferably no thicker than about 50 microns) layer of in-situ-doped monocrystalline silicon is formed (for example by atmospheric-pressure epitaxy using a chemical-vapor deposition or CVD process in ambient comprising a silicon gas such as trichlorosilane or TCS and hydrogen), also called epitaxial growth. After completion of a majority of cell processing steps, a very low-cost backplane layer is bonded to the thin epi layer for permanent cell support and reinforcement as well as to support the solar cell high-conductivity cell metallization. Typically, the backplane material is made of a thin (for instance, about 50 to 250 microns), flexible, electrically insulating polymeric material sheet such as an inexpensive prepreg material (commonly used in printed circuit boards) which meets process integration and reliability requirements. The mostly-processed back-contact, back-junction backplane-reinforced large-area (for instance with a solar cell area of at least 125 mm×125 mm and larger) solar cell is then separated and lifted off from the template along the mechanically-weakened sacrificial porous silicon layer (for example through a mechanical release MR process) while the template may be re-used many times thereby further minimizing the solar cell manufacturing cost. Final cell processing may then be performed on the sunny-side which is exposed after being released from template (for instance, by completing the frontside texture and passivation and anti-reflection coating deposition process).

The combination of back-junction/back-contact cell designs in conjunction with a backplane-embedded interconnect and reinforcement backplane provides an enabling cell architecture for reliable integration of very low-cost power electronics at the cell level using well established electronics assembly methods such as surface mount technology (SMT). In addition to serving as a permanent structural support/reinforcement and providing embedded high-conductivity (e.g., aluminum and/or copper) interconnects for the high-efficiency thin crystalline silicon solar cell, these backplane technologies also allow for the integration of very low-cost power electronics components, such as bypass switches and MPPT power optimizers, on the cell backplanes without interfering with the cell's sunnyside (i.e., there is no efficiency penalty since no active illumination area is consumed by the cell-based electronics mounted on the cell's backside backplane) while maintaining compatibility with proven back-contact module assembly and lamination techniques.

The backplane material may preferably be a thin sheet of a polymeric material with sufficiently low coefficient of thermal expansion (low CTE) not to cause excessive thermally induced stresses on the thin silicon layer. Moreover, the backplane material should meet the process integration requirements for the backend cell fabrication processes, in particular chemical resistance during wet texturing of the cell frontside and thermal stability during the PECVD deposition of the frontside passivation and ARC layer. Moreover, the electrically insulating backplane material should meet module-level lamination process and long-term reliability requirements. While various suitable polymeric (such as plastics, fluoropolymers, prepregs, etc.) and non-polymeric materials (such as glass, ceramics, etc.) may be considered and possibly used as the backplane material, the optimal choice depends on many considerations including but not limited to the cost, ease of process integration, reliability, pliability, etc. One useful material of choice for backplane is prepreg. Prepreg sheets are used as building blocks of printed circuit boards. Prepreg sheets are made from combinations of resins and CTE-reducing fibers or particles. Preferably, the backplane material may be an inexpensive, low-CTE (typically with CTE <10 ppm/° C. and more preferably with CTE <5 ppm/° C.), thin (usually 50 to 250 microns, preferably 50 to 100 microns) prepreg sheet which is relatively chemically resistant in the texture chemistry and is thermally stable at temperatures up to at least 180° C., and more preferably up to at least about 280° C. The prepreg sheet is typically attached to the solar cell backside while still on the template (before the cell lift off process), for example using a vacuum laminator. Upon applying heat and pressure, the thin prepreg sheet is permanently laminated or attached to the backside of the processed solar cell. Then, the lift-off release boundary is defined around the periphery of the solar cell (near the template edges), usually using a pulsed laser scribing tool, and the backplane-laminated solar cell is then separated from the reusable template using a mechanical release or lift-off process. The subsequent process steps may include: (i) completion of the texture and passivation processes on the solar cell sunnyside, (ii) completion of the solar cell high conductivity metallization on the cell backside (which is the solar cell backplane). The high-conductivity metallization (typically comprising aluminum and/or copper but preferably not silver in order to reduce the solar cell manufacturing and material costs) is formed on the solar cell backplane and includes both the emitter and base polarities.

For example, the solar cell design and manufacturing process as described herein have two levels of metallization which are separated by the electrically insulating backplane layer. Prior to the backplane lamination process, essentially the last process on the back-contact solar cell is to form the solar cell base and emitter contact metallization pattern directly on the cell backside, preferably using a thin layer of screen printed or plasma sputtered (PVD) aluminum (or aluminum silicon alloy) material layer. This first layer of metallization (M1) defines the solar cell contact metallization pattern, such as the fine-pitch interdigitated back-contact (IBC) conductor fingers defining the base and emitter regions of the IBC cell. The M1 layer serves to extract the solar cell current and voltage and to transfer the solar cell electrical power to the second level of higher-conductivity solar cell metallization (M2 layer) which will be formed after this first layer of metal (i.e., after M1). After formation of the laminated backplane, subsequent detachment of the backplane-supported solar cell from the template, and completion of the frontside texture and passivation processes, the remaining process is to form the higher conductivity M2 layer on the backplane. A plurality (typically 100's to 1000's) of via holes are drilled (preferably using laser drilling) into the backplane. These via holes land on pre-specified regions of M1 for subsequent electrical connections between the patterned M2 and M1 layers through conductive plugs formed in these via holes. Subsequently, the patterned higher-conductivity metallization layer M2 is formed (by one or a combination of plasma sputtering and plating—e.g., with M2 comprising aluminum and/or copper). For an interdigitated back-contact (IBC) solar cell with fine-pitch (for instance, 100's of fingers) IBC fingers on M1, the patterned M2 layer is preferably designed to be orthogonal to M1 (i.e., the M2 fingers are essentially perpendicular to M1 fingers). Moreover, because of this orthogonal transformation, the M2 layer has far fewer IBC fingers than the M1 layer (for instance, by a factor of about 10 to 50 fewer M2 fingers). Hence, the M2 layer is a much coarser pattern with much wider IBC fingers than the M1 layer. In this embodiment, the solar cell busbars are placed on the M2 layer (and not on the M1 layer) in order to eliminate the electrical shading losses associated with the busbars on cell. Since both the base and emitter interconnections and busbars are made available on the M2 layer on the solar cell backside backplane, the embodiments of this invention can effectively integrate the power electronics component or components on the backplane with access to both the base and emitter terminals of the solar cell on the backplane.

Similar in essence to a very low-cost printed-circuit board, the disclosed solar cell backplane with both polarities of the solar cell on the backplane may be effectively used to electrically assemble and integrate electronic components on the cell backside backplane, without obstructing the sunnyside of the solar cell and without degrading the reliability of the solar cell, hence enabling implementation of distributed shade management with enhanced energy yield, distributed cell-based MPPT power optimization, reduced LCOE, and improved PV system reliability via smarter electricity management through the entire cells and modules. The backplane not only enables direct mounting, attachment, and support of the thin-format electronic components on the solar cell, it also effectively decouples from the sensitive solar cell any detrimental stress effects of the components and their attachments. The embodiments described herein enable smart solar cells and smart solar modules, such as in back-contact solar cells including back-contact/back-junction IBC cells, with permanently attached (e.g., laminated) backplanes. The smart cell includes electronic components such as one bypass switch integrated on the cell backplane and/or one DC-to-DC or DC-to-AC MPPT power optimizer directly attached onto the backplane on each cell.

Intelligent Cellular Shade Impact Suppression (ISIS).

Due to the series wiring of a PV system, a small amount of obstruction on a system's light-absorbing face may lead to large output loss. There are various representative examples of loss of power harvesting capability as a result of cell and module shading. For instance, one published study determined that obstruction on 0.15%, 2.6%, and 11.1% of the PV module surface area causes 3.7%, 16.7%, and 36.5% of output power loss, respectively, hence resulting in a significant reduction of the installed PV system energy yield in case of shading. As discussed earlier, when the current of one obstructed cell drops due to shading, the shaded cell drags down the current of all the other cells wired in series in a string or sub-string (unless corrective action is taken in the design of the module). A novel ISIS or shade management design of the disclosed subject matter integrates an inexpensive piece of electronics (e.g., a very low-cost power electronic bypass switch such as a power Schottky diode or MOSFET or another suitable low-forward-voltage/low-reverse-leakage/low-ON-resistance bypass switch) on each solar cell backplane with direct access and electrical connections to both the solar cell busbars (base and emitter) to enable the automatic re-routing of electricity around any obstructed or shaded cells with minimal impact on the series string and the PV module thereby maximizing power harvesting of the PV module and the overall energy yield output. Additionally, the disclosed ISIS systems and methods disclosed herein may improve the overall cell and module reliability by reducing stress from accumulated heat associated with mismatched current within the modules. An integrated ISIS as disclosed herein eliminates the need for a junction box with external bypass diodes, hence reducing the cost/Wp of the resulting smart module. Further, backplanes used as support substrates for the electronic components effectively isolate and decouple the stress effects of component placement and soldering from the sensitive semiconductor cell layers thus minimizing thermal and mechanical stresses and any detrimental effects of such stresses associated with mounting the ISIS bypass switches on cell backplanes and backsides.

Distributed Maximum-Power-Point Tracking (MPPT) Power Optimizer.

The Maximum Power Point (MPP) is the spot on the current-voltage continuum where a module yields the maximum possible output power under various solar illumination conditions from sunrise through sunset (or starting when the solar cell "wakes up" around sunrise until the cell "sleeps" around sunset). As current and voltage values vary with the solar irradiation flux changes and other operating conditions (such as ambient temperature, etc.) throughout the day, an automated MPP tracker adjusts the operating point of voltage and current on the IV curve in order to operate at the MPP condition (to extract the maximum module power); moreover, the MPP tracker may also preferably adjusts its output current/voltage ratio to match the current values of all the solar cells (and modules) connected in series. The disclosed innovations provide truly distributed implementation of very low-cost Maximum Power Point Tracking (MPPT) Power Optimization circuitry at the cell level by integrating smart electronics onto each cell backside via the backplane. For example, if one external micro-inverter (or alternatively, one DC-to-DC converter) per module and module-level MPPT using each external micro-inverter (or alternatively, one DC-to-DC converter) is used, this configuration may produce 100% of power from a first string and, for instance, 97% of power from a second string. This would achieve an improved power harvesting of 98.5% of the full power from the PV installation, a substantial improvement compared to the traditional centralized inverter MPPT arrangement.

When extended and applied to the cell-level MPPT power optimization as disclosed herein, this solution not only enables substantially improved power harvesting from each and every cell under various illumination and cell shading conditions hence further maximizing the overall module energy yield compared to conventional methods, it also enables packaging of mismatched cells (cells from different manufacturing bins with different parametrics such as $V_{mp}$ and/or $I_{mp}$ values) within a given module and eliminates the impact of module mismatching at the system level.

Various embodiments of the disclosed systems, by integrating smart power electronic capabilities at the cell level through distributed cellular ISIS and/or cellular MPPT power optimizer electronics, provide significant cost improvements including less than $0.20/Wp installed power electronics, less than $0.50/Wp for balance of systems and installation (total BOS), and LCOE <$0.10/kWh (in some instances with LCOE capability of reaching <$0.05/kWh). As described earlier and in contrast to the disclosed systems and methods, conventional power electronics exist at the module level (external DC-to-DC converter box or DC-to-AC micro-inverter box attached to the PV module) or at the installed PV system level (more traditional centralized inverter MPPT). Embodiments in accordance with the disclosed subject matter achieve substantially more gain and benefits than today's existing PV solutions through novel and unique distributed cell-level MPPT Power Optimization and maximum power extraction optimization enabled by back-junction cells, including back-contact/back-junction IBC cells, and backplane technology (with the backplane providing access to both the solar cell electrical leads or busbars, and providing support for placement of the electronic components opposite the sunnyside of the solar cell). The disclosed subject matter achieves these substantial gains with only incrementally higher cost, thereby substantially reducing LCOE, due to ease of process integration within existing manufacturing process (power electronics components such as bypass switches and MPPT power optimizer components may be directly mounted onto the backplane on the cell backside without a need for expensive manufacturing steps) while providing substantially increased energy yield (including the elimination of cell and module mismatching). While current module-level DC-to-DC converter boxes tend to claim up to 25% increased energy yield, these solutions incur a cost typically above $0.20/Wp; in contrast, the novel embodiments disclosed herein (i.e., the unique distributed cellular ISIS and cellular MPPT power optimizer solution) increase the overall PV module and installed PV system power output and energy yield of the system significantly while reducing the implementation cost to below $0.20/Wp.

In addition, the distributed cellular power optimization solutions disclosed herein may provide:

Improved inverter reliability—managing voltage and current to predictable levels removes stress on the centralized inverter (i.e., no overvoltage) and improves overall conversion efficiency. Further, the centralized inverter design may be simplified and cost reduced as a result of the truly distributed cellular MPPT Power Optimization solution.

Anti-islanding—fully embedded smart power circuitry enables distributed tracking and communication within the module, among the modules, and between the modules and locations outside the PV installation to allow automatic shut-off for emergencies and easier and safer installations and maintenance.

Ability to ignore shading and design flexible string lengths and planes will mean less expensive system design analyses and cheaper overall installation costs.

Cell/module monitoring leads to improved servicing, cleaning, performance forecasting, and preventive maintenance actions.

Intelligent Cellular Shade Impact Suppression (ISIS) Solution Using Bypass Switches Integrated with Solar Cells.

The following section describes various ISIS implementation embodiments. Considerations and criteria relating to selection of a bypass electronic switch for use in the distributed cellular shade management (ISIS) systems disclosed, without substantial power dissipation losses in the distributed switches, include, but are not limited to:

A cellular bypass switch with a small on-state voltage drop, in some instances far smaller than that of a forward-biased diode. For example, assuming $V_{mp}$=575 mV and $I_{mp}$=9.00 A (corresponding to approximately $V_{oc}$=660 mV and $I_{SC}$=9.75 A), an on-state voltage of 50 mV would result in an on-state power dissipation of 0.45 W which is less than 10% of that of a diode (this calculation excludes any loss associated with the switch $R_{series}$).

A cellular bypass switch with a very small on-state series resistance to minimize the on-state switch power dissipation. Preferably an on-state switch $R_{series}$ less than or equal to 10 mΩ (for example $R_{series}$=5 mΩ, ohmic power dissipation of switch=0.405 W).

A bipolar junction transistor (BJT) or a MOSFET or any suitable switch circuitry comprising such components providing relatively low voltage drop and small $R_{series}$.

For example, a bypass switch with the following functionality may be used as an electronic component:

Low power dissipation when the bypass switch is turned ON (forward biased). For example, the power dissipation may be no larger than a fraction of the average cell power production. For instance, for a 5 Wp cell a bypass switch selected to limit the power dissipation to no more than about 1 W when the full cell string current passes through the bypass switch of the shaded cell.

Low reverse leakage current when the bypass switch is OFF (reverse biased).

A thin component package (for example <<2 mm or even as low as <1 mm).

Capable of handling the full current of the cell string.

Figure 13:
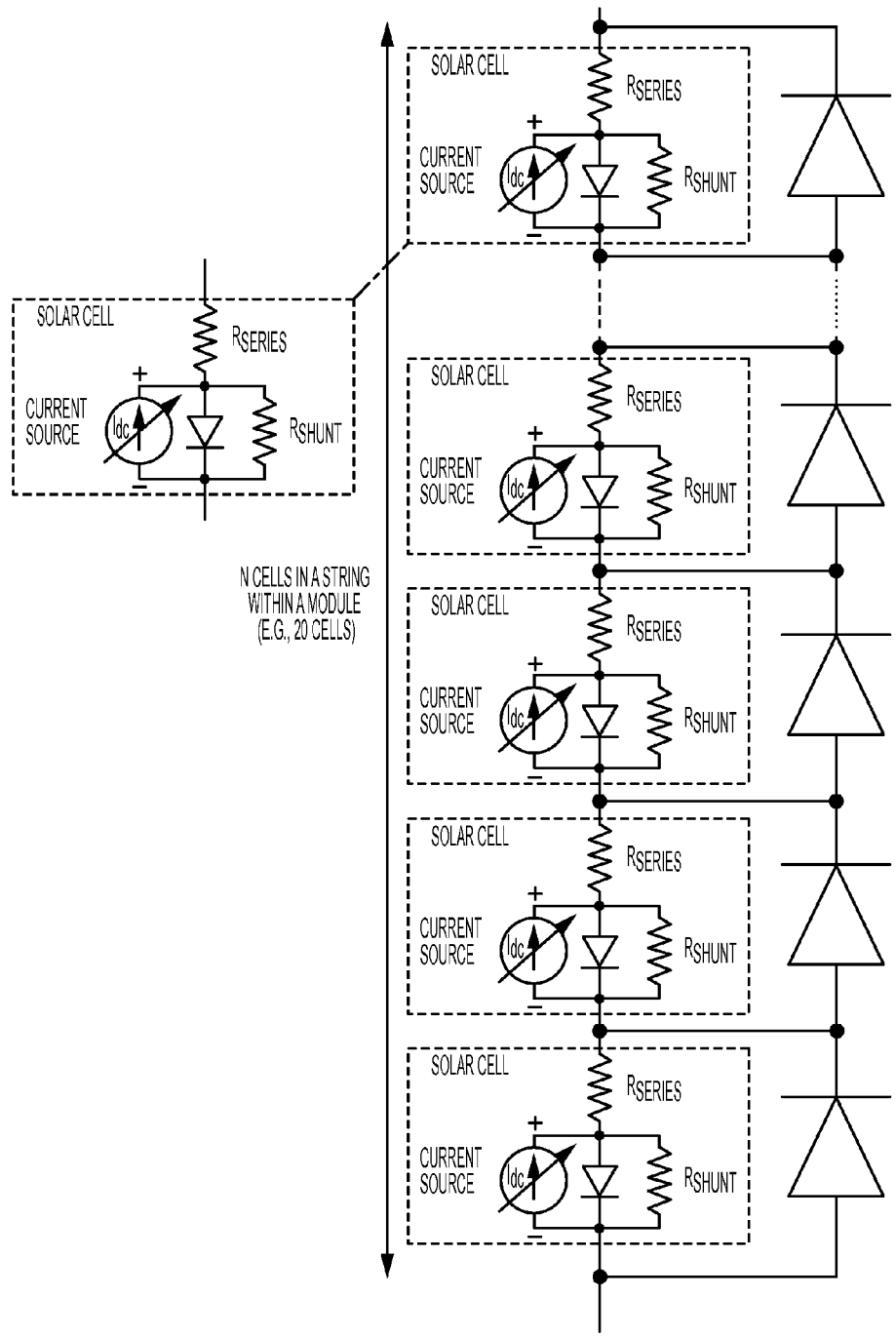
FIG. 13 is a schematic diagram showing a distributed cellular shade management system with one bypass diode per solar cell (solar cells shown with their equivalent circuit diagrams)

FIG. 13 is a schematic diagram showing a distributed cellular shade management system, referred to herein as Intelligent cellular Shade Impact Suppression or ISIS, using one low-Vf (low forward bias voltage) bypass diode (which may also be one low Vf bypass switch such as a low-Vf Schottky diode) per each solar cell (shown with its equivalent circuit model) attached to each cell backside backplane and laminated within the module. This distributed bypass switch arrangement eliminates the need for the external junction box bypass diodes and improves the overall energy yield performance of the modules in PV installations compared to the known arrangement of one bypass diode per multi-cell sub-string (typically one bypass diode per 20-cell substring in known configurations). Since one bypass switch (such as a rectifying diode such as Schottky diode in this example) per cell is used, the entire module may be wired as a single string of all the cells within the module connected in series (e.g., one string of 60 cells connected in series for a 60-cell module). Thus, the use of the ISIS architecture in accordance with the disclosed subject matter eliminates the need for multiple sub-strings within the module.

Figure 14:
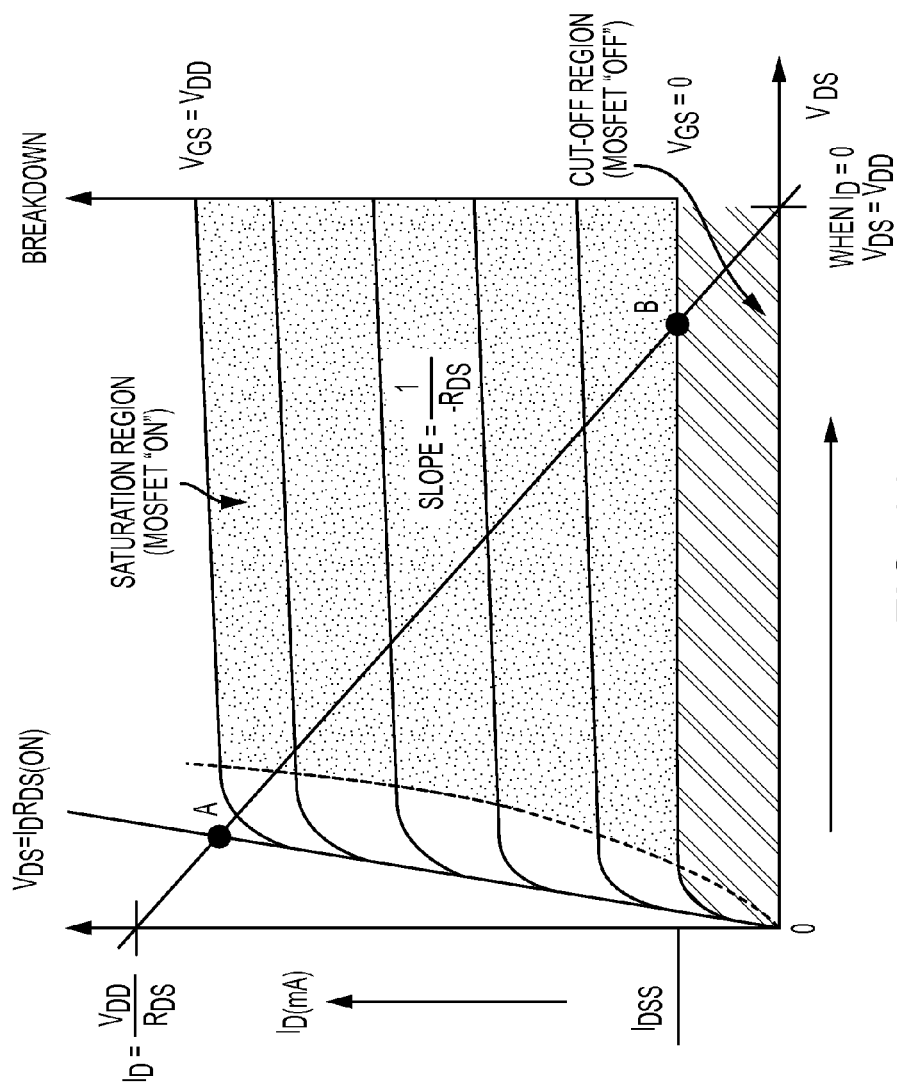
FIG. 14 is a graph showing the IV characteristics of a metal-oxide-semiconductor field-effect transistor (MOSFET) which may be used as a bypass switch (or as part of a bypass switch circuitry)

FIG. 14 is a graph showing that power metal-oxide-semiconductor field-effect transistor (MOSFET) with suitable specifications may be used (stand alone or as part of a switch circuitry) as an effective bypass switch for distributed bypass switches attached to the cell backplanes for integrated shade management solution (ISIS). For example, using enhancement-mode MOSFET as the switch, when $V_{GS}$>0 turn MOSFET on and $V_{GS}$=0 turn MOSFET off:

When $V_{GS}$ is zero, the MOSFET is OFF and the output voltage ($V_{DS}$) is equal to $V_{DD}$.

When $V_{GS}$>0 or equal to $V_{DD}$, the MOSFET bias point (Q) move to point A along the load line. The drain current $I_D$ rises to its max value due to a reduction in the channel resistance. $I_D$ becomes a constant independent of $V_{DD}$ and depends only on $V_{GS}$. Thus, the transistor behaves like a closed (ON) switch and the channel ON resistance does not reduce fully to zero due to its $R_{DS}$(on) value but gets very small.

When $V_{GS}$ is LOW or zero, the MOSFET bias-point moves from A to B. The channel resistance is very high so the MOSFET is OFF. If $V_{GS}$ toggles between these two values, the MOSFET behaves as a single-pole single-thrown switch.

Appropriate power MOSFETs usually have $R_{series}$ of less than 0.01Ω (or less than 10 mΩ).

Power MOSFET switches typically have surge-current protection. For high-current applications bipolar junction transistors may be used.

Figure 15:
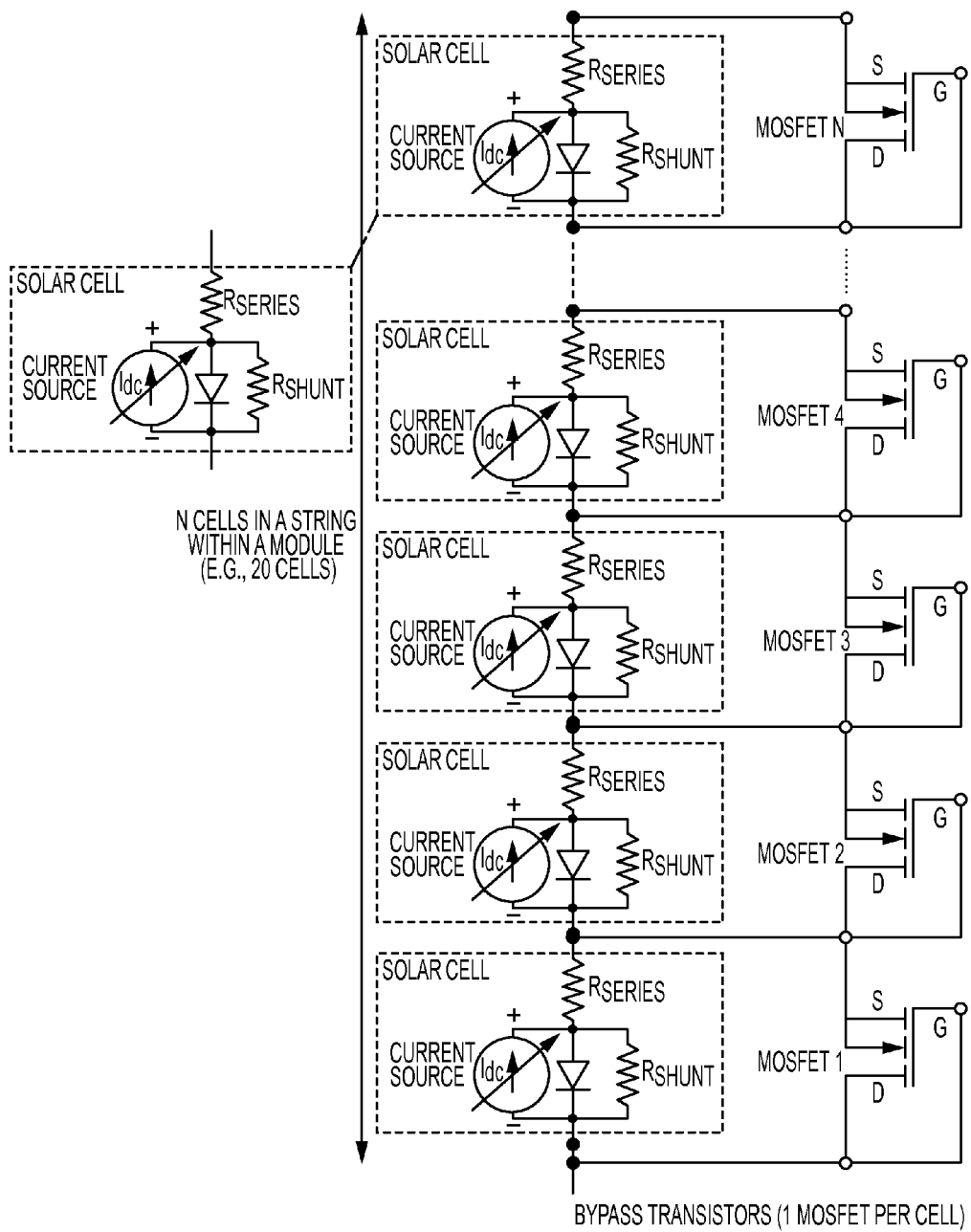
FIG. 15 is a schematic diagram of an ISIS distributed cellular shade management implementation in accordance with the disclosed subject matter (specifically an embodiment using MOSFETs or circuitry comprising MOSFETs as bypass switches)

FIG. 15 is a schematic diagram of an ISIS distributed cellular shade management implementation in accordance with the disclosed subject matter using one very low-Vf power MOSFET-based bypass switch per solar cell (the switch comprising MOSFET or monolithic circuitry including MOSFET) attached to each cell backside and laminated within the module. Again, this distributed bypass switch arrangement will eliminate the need for the external junction box bypass diodes and improve energy yield of the module as compared to an arrangement of one bypass diode per multi-cell sub-string (typically one bypass diode per 20-cell sub-string in known configurations). In this system, if no cells are shaded the bypass diode remains in the reverse bias state and the solar cell string operates normally contributing fully to the power generation of the solar module. If any of the cells are partially or fully shaded, the shaded cell(s) is (are) reverse biased and the bypass transistor switch(es) is (are) turned on, eliminating the possibility of a hot-spot or damage to the solar cell.

Figure 16:
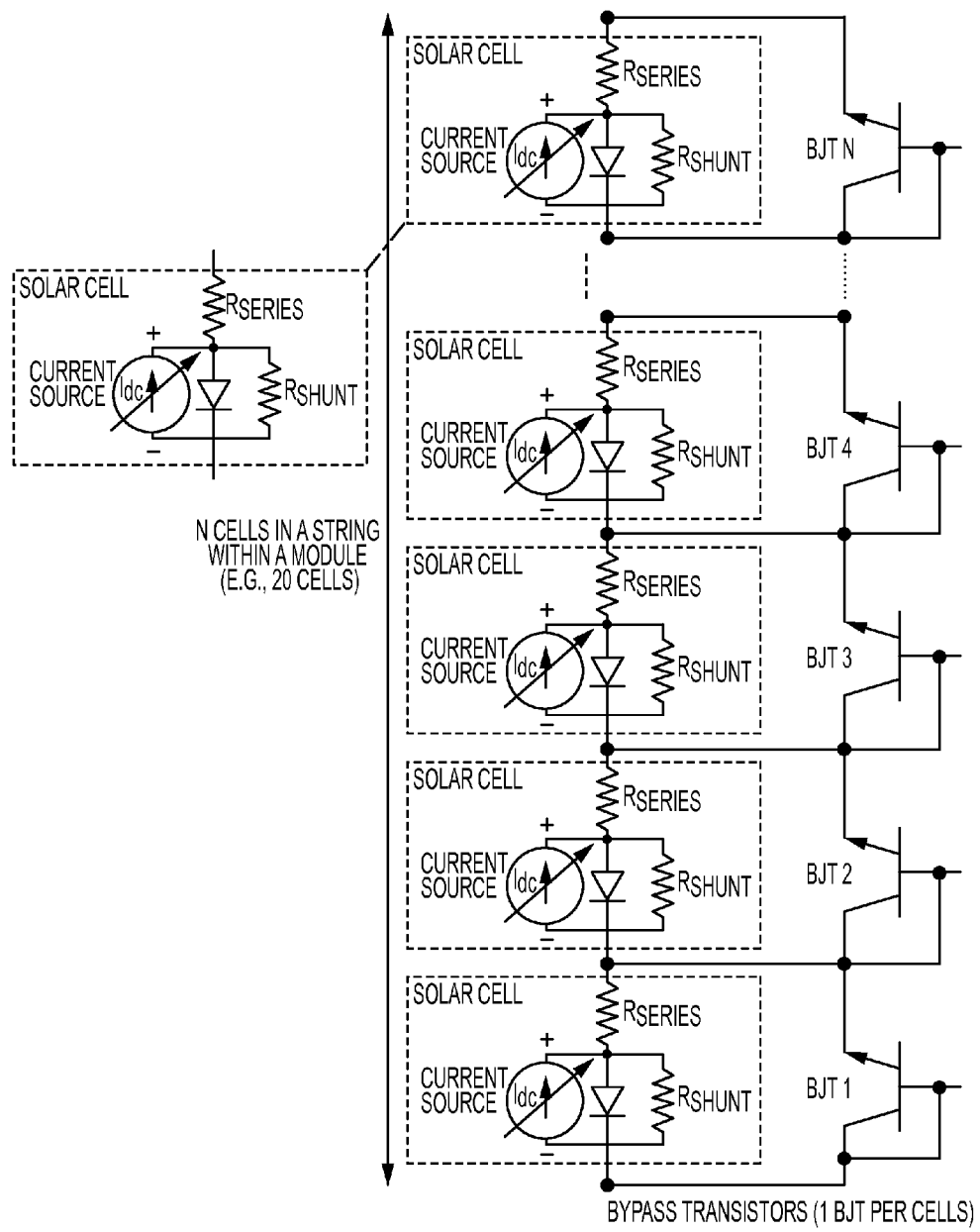
FIG. 16 is a schematic diagram of an ISIS distributed cellular shade management solution in accordance with the disclosed subject matter (specifically an embodiment using Bipolar Junction Transistors—BJTs or circuitry comprising BJTs as bypass switches)

FIG. 16 is a schematic diagram of an ISIS distributed cellular shade management solution in accordance with the disclosed subject matter using one very low-Vf power bipolar junction transistor (BJT) based bypass switch per solar cell (the switch comprising BJT or monolithic circuitry including BJT) attached to each cell backside and laminated within the module. The base and collectors of the bipolar transistors are connected together. This distributed bypass switch arrangement will eliminate the need for the external junction box bypass diodes and improve energy yield of the module compared to an arrangement of one bypass diode per multi-cell sub-string (typically one bypass diode per 20-cell substring in known configurations). In this system, if no cells are shaded the bypass transistor switch remains in the OFF state and the solar cell string operates normally contributing fully to the power generation of the solar cell. If any of the cells are partially or fully shaded, the shaded cell(s) is (are) reverse biased and the bypass transistor switch(es) is (are) turned ON, eliminating the possibility of a hot-spot or damage to the shaded cell.

And although embodiments of the disclosed subject matter may be applied to any type of solar PV cells and modules, ISIS may be particularly advantageous for application with back-contact-type solar cells (either front-junction or back-junction) utilizing a backplane attachment on the cell backside. The electrically insulating backplane layer on the cell backside enables attachment of electronic components onto the cell backside without mechanical or thermal stress problems affecting the active cell region. And because the active cell and the electronic components are positioned on the opposite sides of the backplane there is minimal or no efficiency penalty due to loss of active cell illumination area because of placement of electronics components.

Figure 17:
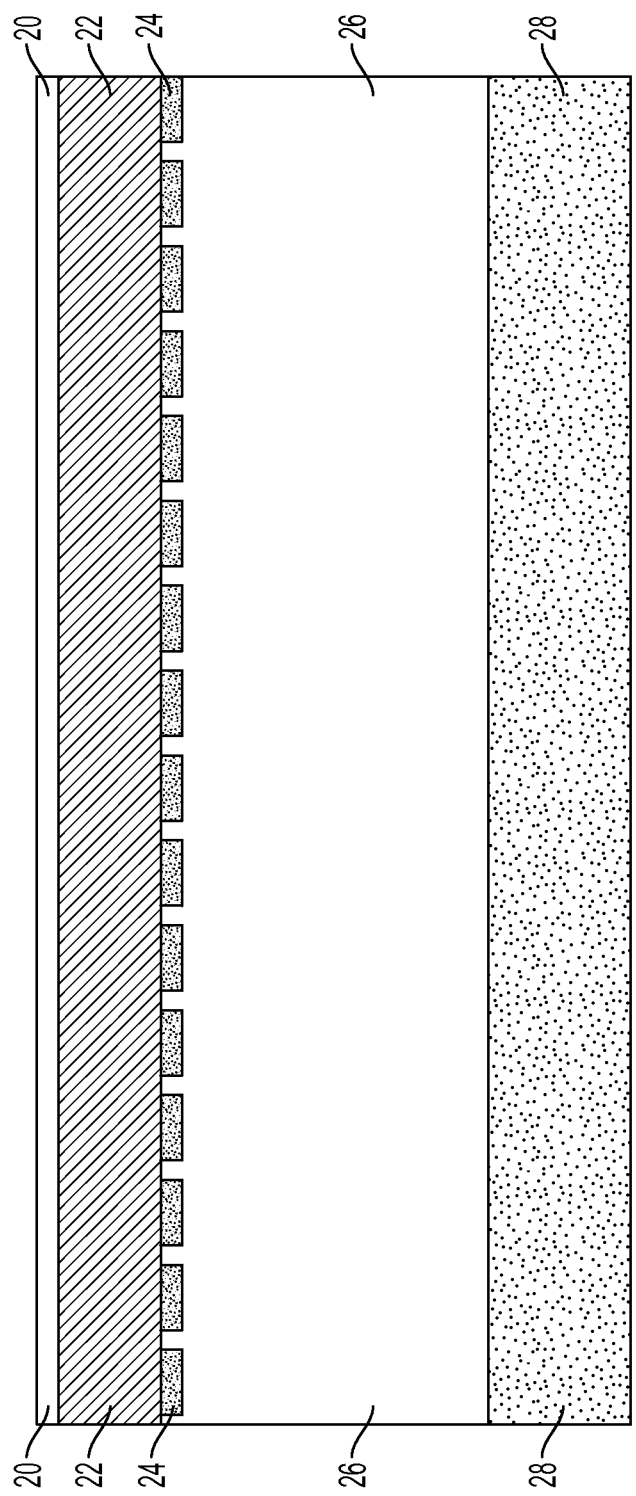
FIG. 17 is a cross-sectional diagram of a back-contact/back-junction crystalline semiconductor solar cell which includes a backplane support layer.
Figure 19:
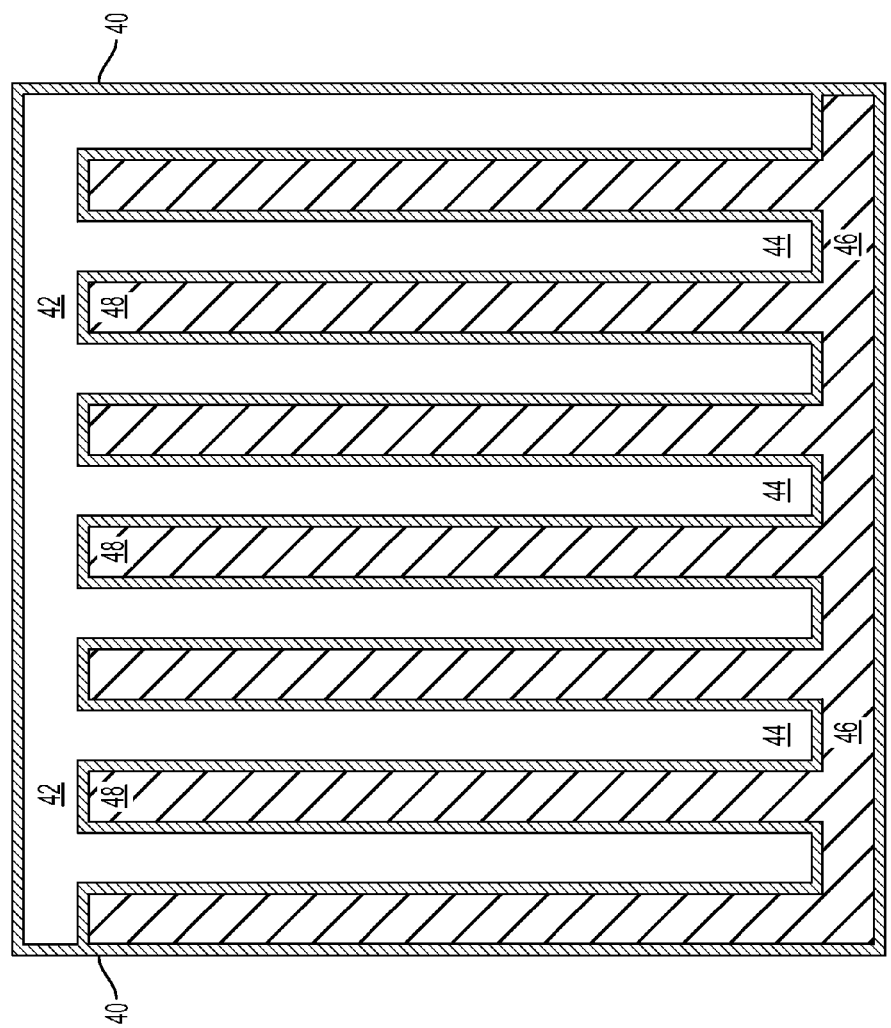
FIG. 19 is diagram showing the top view of the backplane and representative interdigitated back-contact (IBC) metallization pattern of a solar cell.

FIG. 17 is a representative schematic cross-sectional diagram of a back-contact/back-junction crystalline semiconductor solar cell, such as an thin mono-crystalline silicon solar cell (for example having a ≤50 µm mono-crystalline silicon absorber layer), having a laminated or attached electrically insulating backplane layer with high-electrical-conductivity cell interconnects (for example, comprising aluminum and/or copper metallization) on the side opposite of the sunnyside of the cell (referred to as the backside). The back-contact/back-junction crystalline semiconductor solar cell shown in FIG. 17 comprises thin or ultrathin crystalline semiconductor substrate 22, substrate 22 may be a large area cell for example a 125 mm×125 mm or 156 mm×156 mm sized (or any other large area with areas from about 150 cm² to over 1000 cm²) substrate. The cell sunnyside is the light receiving surface of the cell and may comprise frontside texture, as well as passivation and anti-reflective coating layer 20. Relatively fine-pitch on-cell metallization (the M1 metallization layer) fingers 24 are positioned on the cell backside prior to the backplane attachment, for example in the form of an interdigitated back contact aluminum metallization finger pattern (for example a pattern of hundreds of fine-pitch metallization fingers without any on-cell busbars). Backplane 26 may be a permanently laminated backplane on the cell backside having a thickness, for example, in the range of 0.05 mm to 0.50 mm (for example 0.05 mm to 0.25 mm), which allows for the attachment of electronic components on the cell backside without stress issues on the active cell. Backplane 26 may comprise conductive via plugs (for example aluminum and/or copper via plugs) embedded within or positioned on the backplane, to electrically connect high-conductivity cell interconnects 28 on the backside of the cell (M2 metallization) to on-cell interdigitated back contact metallization (M1 metallization) fingers 24. FIG. 19 highlights an example embodiment of high-conductivity cell interconnects 28 (M2 metallization), for example in the form of orthogonally transformed dual busbar IBC metallization pattern with aluminum and/or copper fingers having a thickness in the range of a few microns up to 100 µm and, for example, from four to tens of pairs of base/emitter metallization fingers.

Figure 18:
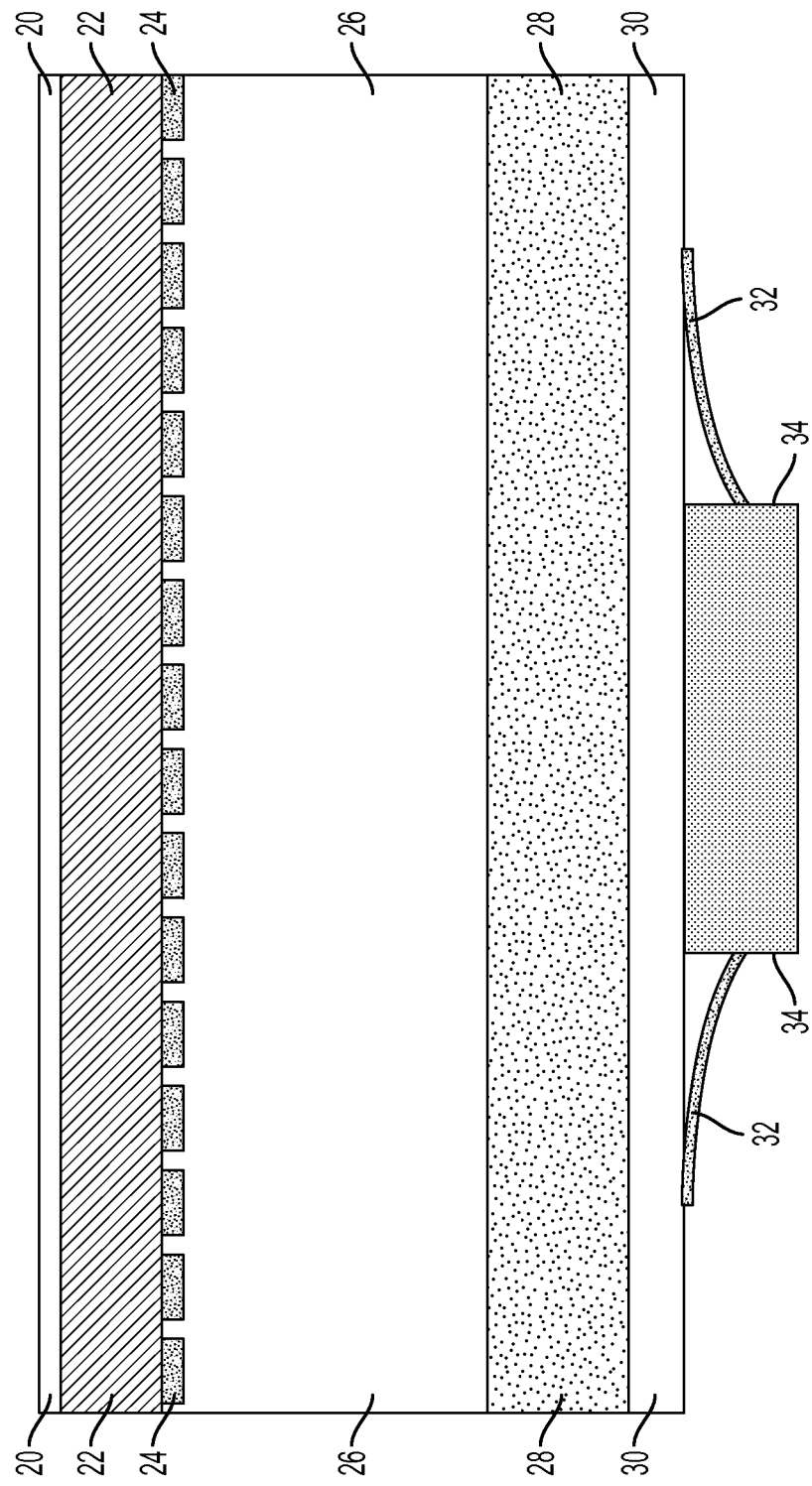
FIG. 18 is a cross sectional diagram of a back-contact/back-junction crystalline semiconductor solar cell similar to the cell shown in FIG. 17 with at least one on-cell electronic component mounted on and attached to a backplane layer.

FIG. 18 is a cross sectional diagram of a back-contact/back-junction crystalline semiconductor solar cell similar to the cell shown in FIG. 17 with on-cell electronic components (single monolithic component attachment shown) comprising electrical insulator layer 30, on-cell electronic component 34, and electrically conductive leads 32 positioned on the back side of the cell. As shown, electronic component(s) 34 are mounted onto (or within) the backplane and electrical leads 32 are connected to the cell interconnects. The cell-level electronics components placed onto the cell backplane may be the bypass switch and optionally the MPPT DC-to-DC (or MPPT DC-to-AC) power optimizer. As shown in the cell in FIG. 18, the power electronics parts are positioned on the backside of the cell and decoupled/separated from the active cell absorber by the backplane. Optional electrical insulator layer 30 providing electrical insulation may be a sprayed or screen printed layer or an attached sheet. Without electrical insulator layer 30 the electrical leads 32 may have insulation jacket around them to allow for electrical connections of the leads only at the pre-specified sites (by soldering or conductive epoxy). Electrically conductive leads 32 (for example two leads in the case of a bypass switch) may be electrically attached to the cell busbars (and/or IBC fingers) in order to provide the required electrical interconnections between the integrated shade management and/or MPPT power optimization (for example DC-to-DC or DC-to-AC power optimizer) components of electrical component 34 and the solar cell leads. On-cell electrical component 34 may comprise a bypass switch and/or a DC-DC MPPT or DC-AC MPPT power optimizer. Other possible status monitoring and reporting electronic components may also be used. The MPPT power optimizer attached to the cell may be remotely programmable to shut off and turn on the solar cell, to re-program the current and/or voltage outputs, and to provide status of the solar cell (including but not limited to the cell power, temperature, etc.).

FIG. 19 is diagram showing the top view of the backplane and IBC metallization (M2 metallization) pattern of a solar cell (such as that shown in FIGS. 17 and 18), in other words FIG. 19 shows the backplane side of the solar cell (opposite the sunnyside). As shown here, the backplane side includes the high-conductivity cell metallization interconnects (M2 metallization), shown as emitter busbar 42 and corresponding emitter metallization fingers 44 and base busbar 46 and corresponding base metallization fingers 48, positioned on backplane surface 40 (backplane surface 40 shown as backplane 26 in FIGS. 17 and 18). In the back-contact/back-junction IBC architecture of FIG. 19, the interconnect pattern is an interdigitated pattern with two busbars (emitter and base busbars) on two sides of the backplane. As described previously, the number of interdigitated high-electrical-conductivity fingers on the backplane may be much smaller than the number of on-cell metallization fingers (shown as on cell metallization fingers 24 in FIGS. 17 and 18) due to an orthogonal transformation of the metallization pattern from on-cell to on-backplane interconnects (e.g., the number of on-backplane fingers may be a factor of about 10× to 50× less than the number of on-cell IBC fingers) so the fingers on the backplane run essentially perpendicular to the fingers on the cell. The fingers on the backplane may be attached to the surface of the backplane or may be embedded within the backplane and the busbars may be positioned on the backplane. The power electronics component(s) may be mounted on and attached to this backplane surface (with proper electrical insulation if necessary) while connecting the appropriate electrical leads to the base and emitter busbars on the backplane surface (for example by soldering, conductive epoxy bumps, or another suitable attachment technique).

Figure 20:
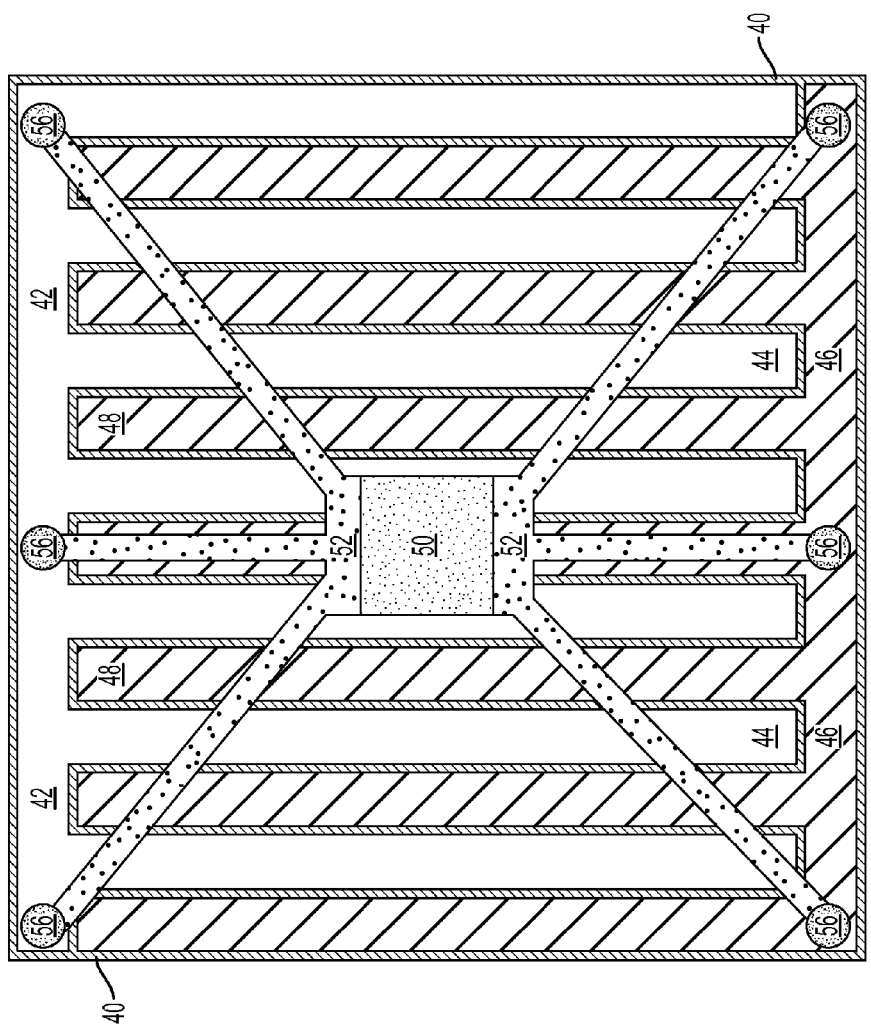
FIG. 20 is a diagram showing the top view of the backplane of the solar cell in FIG. 19 having a bypass switch directly attached to the cell terminals or busbars on the cell backside and which minimizes hot spots by providing high conductivity attachments of the bypass switch leads to the emitter and base busbars.

FIG. 20 is a diagram showing the top (backplane side opposite the sunnyside) view of the backplane of the solar cell in FIG. 19 having a suitable thin-format bypass switch directly attached to the solar cell base and emitter terminals on the backplane side (cell backside). On-cell bypass switch 50 is connected to high-conductivity cell metallization (M2) interconnects by electrical lead 52 which is connected to base busbar 42 and emitter busbar 46 by soldered joints 56. As shown, and for example, the M2 interconnect pattern may be an interdigitated pattern with two busbars on two sides of the backplane (emitter and base busbars). The bypass switch may have a very thin flat package (e.g., preferably with a package thickness of less than 1 mm) and have high-electrical conductivity terminals (for example in the form of flat ribbons). Each terminal of the bypass switch may be electrically soldered or attached by a conductive epoxy to one or multiple points (multiple points shown) on each busbar (emitter and base busbars) to ensure minimum ohmic losses through the cell when the bypass switch is activated and turned on by shading. The bypass switch electrical leads may be properly electrically insulated from the interdigitated fingers on the backplane.

For example, commercially available representative embodiments of bypass switches for direct assembly on cell backplanes to form smart cells and modules enabling distributed shade management solution (ISIS) include: a thin-package (0.74 mm), low-forward-voltage (low-Vf) 10 A Schottky diode suitable for use as bypass diode (bypass switch); and, an ultra-low-forward-voltage (ultra-low-Vf) component, suitable for use as a near-ideal bypass switch.

Additionally, a low-forward-voltage (low-Vf) switch known as a Super Barrier Rectifier (SBR) using MOSFET technology, may also be suitable for use as bypass switch for direct assembly on cell backplanes to form smart cells and modules enabling distributed shade management solution (ISIS). A SBR provides a lower forward bias voltage and lower reverse leakage current than a conventional Schottky barrier diode. Further, a SBR may provide thermal stability and reliability characteristics comparable to conventional pn junction diodes but with additional properties superior for application in ISIS. Thus, a low-forward-voltage (low-Vf) switch called Super Barrier Rectifier (SBR) may also be suitable for use as a bypass switch for direct assembly on cell backplanes to form smart cells and modules enabling the distributed shade management solution of the disclosed subject matter. The combination of low-forward-bias and small reverse leakage for the SBR switch technology may make it a very attractive and suitable bypass switch candidate for ISIS.

Yet another example of commercially available representative embodiments of bypass switches for direct assembly on cell backplanes to form smart cells and modules enabling distributed shade management solution (ISIS) include a low-forward-voltage (low-Vf) switch known as a Cool Bypass Switch (CBS) using MOSFET technology. Various packaging is available for commercially available low-forward-voltage (low-Vf) Schottky diodes and also low-forward-voltage switch called Cool Bypass Switch (CBS) using MOSFET technology.

Distributed Cellular DC-to-DC MPPT Power Optimization or DC-to-AC MPPT Power Optimization by Positioning Power Optimizer Electronics Directly on the Cell Backplanes of Cells.

Figure 21:
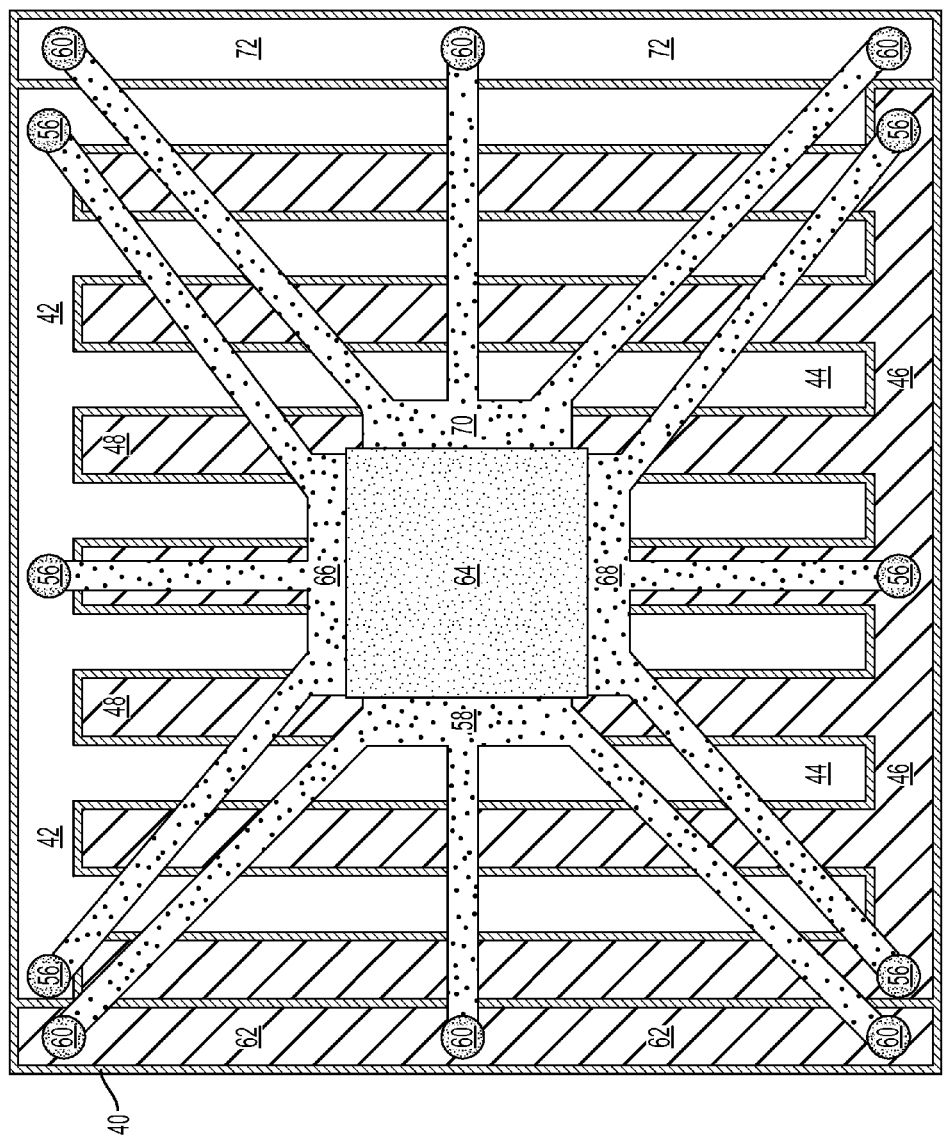
FIG. 21 is a diagram showing the top view of the backplane of the solar cell in FIG. 19 with a DC-to-DC MPPT power optimizer, or a DC-to-AC MPPT power optimizer, directly mounted on and attached to the cell terminals, at the emitter and base busbars, on the backplane side.

FIG. 21 is a schematic diagram showing the top view of the backplane of the solar cell along with the M2 interconnect pattern in FIG. 19 with a DC-to-DC MPPT power optimizer, or a DC-to-AC MPPT power optimizer, directly attached to the cell terminals on the backplane side. In this example shown, the power optimizer chip (e.g., either a DC-to-DC or a DC-to-AC power optimizer) is shown to have two input terminals (with inputs connected to the solar cell base and emitter busbars) and two output terminals (which provide the adjusted output current/voltage of the power optimizer chip and are connected to the external pairs of busbars on the backplane). The input terminals of on-cell power optimizer (for example a DC-to-DC MPPT or a DC-to-AC MPPT power optimizer) are connected to high-conductivity cell metallization interconnects by positive input electrical lead 66 and negative input electrical lead 68 which are connected to positive (emitter) busbar 42 and negative (base) busbar 46 of the solar cell by soldered joints 56. And negative output electrical lead 58 and positive output electrical lead 70 connect on-cell power optimizer 64 by adjusted output terminals to negative output lead busbar 62 and positive output lead busbar 72 by soldered joints 60. The on-cell power optimizer 64 effectively provides a variable impedance input for the solar cell in order to operate the solar cell at its maximum-power point at all times, while providing the maximum cell power at its output terminals with pre-specified level of constant current (for current matching in series connected cells) or with pre-specified level of constant voltage (for voltage matching in parallel connected cells).

As shown in FIG. 21, the backplane side of the cell comprises high-conductivity cell metallization interconnects (M2 layer), for example made of aluminum and/or copper. The M2 interconnect pattern may be an interdigitated pattern with two busbars (emitter and base busbars) on two sides of the backplane surface. The MPPT power optimizer electronics (for example a single-chip package) have a thin flat package (e.g., preferably with a package thickness of less than 1 mm) and high-electrical conductivity terminals (for example flat ribbons). Each input terminal of the MPPT power optimizer electronics may be electrically soldered or attached by a conductive epoxy to one or multiple points on each busbar (emitter and base busbars) in a manner to minimize ohmic losses in the cell. Similarly, each output terminal of the MPPT power optimizer electronics may be electrically soldered or attached by a conductive epoxy to one or multiple points on each output busbar in a manner to minimize ohmic losses in the cell.

Output busbars 62 and 72 shown in FIG. 21 are optional. If output busbars are used, they may be formed on the backplane at the same time during the cell fabrication process as the other cell backplane M2 interconnect fingers and emitter and base busbars. If output busbars are not used, the output terminals of the MPPT power optimizer electronics may be directly used as the cell output terminals during the final PV module assembly and cell to cell interconnections.

Figure 22:
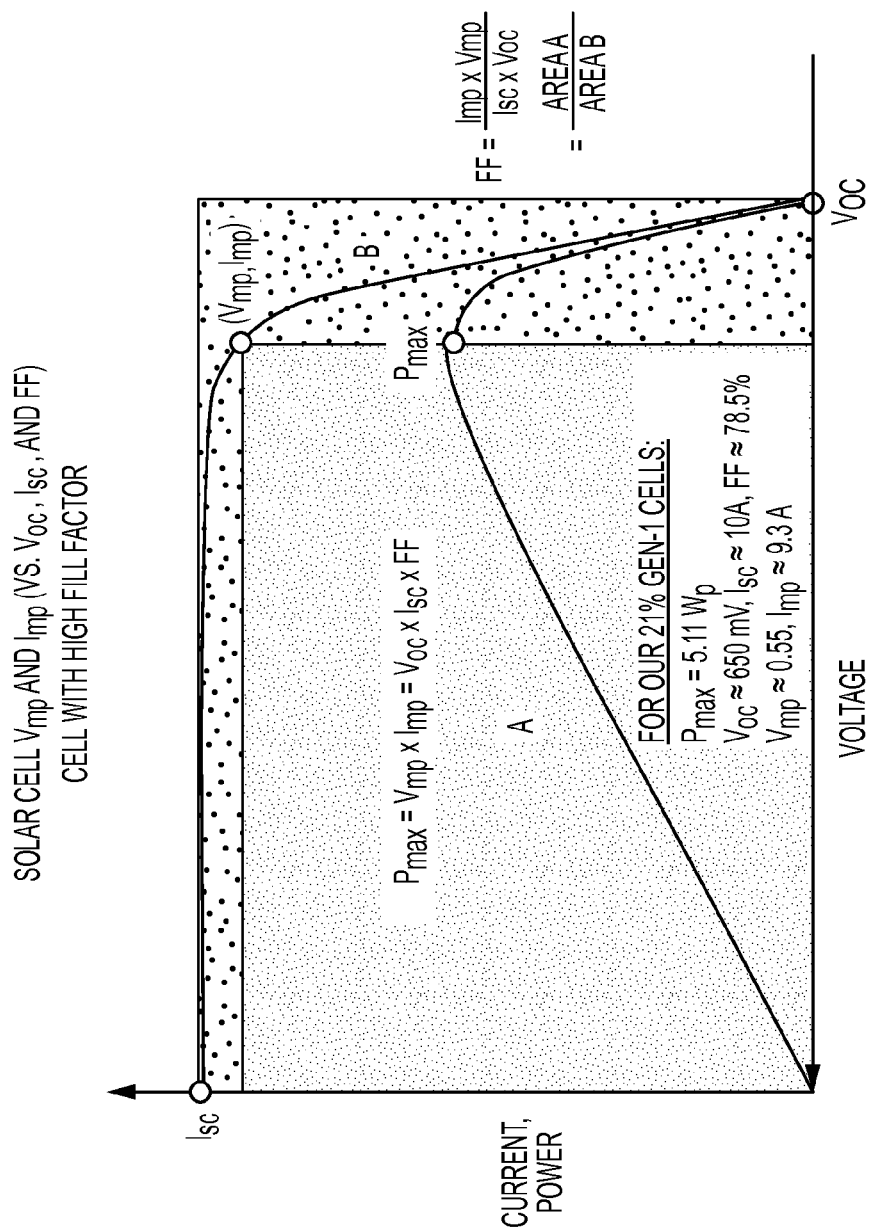
FIG. 22 is a graph showing solar cell IV characteristics and Maximum Power Point (MPP) for maximum power harvesting at a given sunlight illumination level.

An aspect of the disclosed subject matter is attachment of MPPT power optimizer electronics (DC-to-DC or DC-to-AC) on the cell backplane. FIG. 22 is a graph showing solar cell IV characteristics and Maximum Power Point (MPP) for maximum power harvesting at a given illumination (e.g., 1

Figure 23:
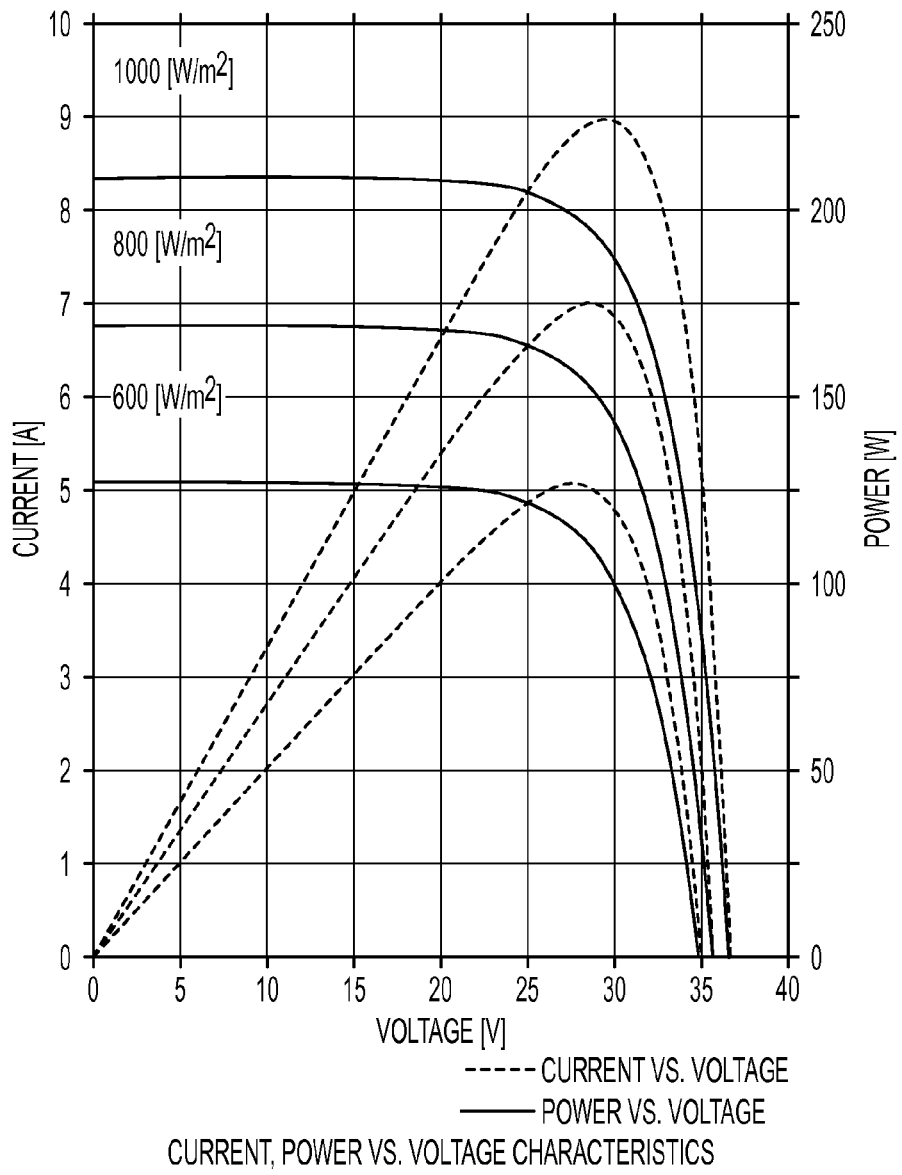
FIG. 23 is a graph for representative a solar module showing power vs. voltage characteristics, and the peak maximum power points of operation, under different solar module illumination intensities.

SUN illumination). (The MPP is different for different levels of solar cell illumination intensity). And as an example, FIG. 23 is a graph for representative solar module IV showing power vs. voltage characteristics under different solar module illumination intensities from ~0.4 sun to ~1 sun. In order to maximize power harvesting from sunrise to sunset, cell embodiments in accordance with the disclosed subject matter enable placement of MPPT power optimizer electronics on each cell backside (backplane) in order to maximize energy yield of PV modules and PV systems while achieving very high system level reliability and very low LCOE.

There are a number of commercially available single-chip DC-to-DC MPPT power optimizer electronics suitable for the cellular (cell level) MPPT Power Optimization applications disclosed herein. Alternatively, it is possible to design and manufacture a monolithic (or nearly monolithic) MPPT power optimizer which is optimized for a given solar cell. While some example chips may have an overkill design and offer excessive power capability for distributed cell-level MPPT power optimizer electronics on cell backside/backplane implementations, much lower power (e.g., 5 to 10 Watt max) single-chip solutions may also be used for direct mounting and attachment onto the cell backplane.

By placing distributed MPPT power optimizers on the backplanes of cells and laminating them within solar modules, the distributed MPPT DC-to-DC (or DC-to-AC) Power Optimization solutions disclosed herein provide a wide range of capabilities and benefits including, but not limited to, the following:

Total mitigation of shading effects and substantial enhancement of power harvesting of PV modules and installed PV systems compared to module-level DC-to-DC inverter box or DC-to-AC micro-inverter box or centralized inverter MPPT power optimization.

Eliminating the need for separate bypass diodes or bypass switches.

Harvesting power from shaded cells instead of shunting and bypassing the shaded cells.

Enabling the fabrication of PV modules from mismatched cells with different binning parametrics.

Reducing the effective cost per watt of manufactured modules.

Eliminating the need for module-level MPPT DC-to-DC (or DC-to-AC) power optimizers.

Distributed MPPT power optimizers (DC-to-DC or DC-to-AC) mounted onto and attached to each cell backplane prior to final module lamination enables complete remote-access status monitoring, diagnostics, and control at the cell level. Each cell may be remotely monitored and controlled (e.g., by shutting off the cell or turning it back on) and the status of the cells and module may be monitored in real time.

Cell level communications may be provided via wireless communications (WiFi) or RF/AC modulation over the PV Module power leads.

Distributed cellular MPPT power optimizer electronics may provide real time status of the cells and their relative performance compared to the other cells in the module and in the installed PV system.

Remote access signals may address and re-program the distributed MPPT power optimizer electronics for various tasks such as overall PV module or system shut off or start-up (e.g., during maintenance, installation, start-up, etc.), or adjusting desired MPPT module current and/or voltage, etc.

May provide real-time metrics for the installed PV system in the field, such as cell temperature (on the backplane side).

While the embodiments described herein have been largely explained in conjunction with back-contact/back-junction crystalline silicon solar cells using very thin mono-crystalline silicon absorber layers and backplanes, it should be understood that the aspects of the disclosed subject matter may be applied to other solar cell and module implementations by one skilled in the art, including but not limited to the following: front contact solar cells and PV modules comprising such cells; non-crystalline silicon solar cells and modules such as those made from crystalline GaAs, GaN, Ge, and/or other elemental and compound semiconductors; and, wafer-based solar cells including back-contact/front-junction, back-contact/back-junction and front-contact solar cells made from crystalline semiconductor wafers (such as crystalline silicon wafers).

However, as noted earlier, the use of back-contact cells may be advantageous as the aspects of the disclosed subject matter may be applied to back-contact cells without substantially impacting final module manufacturing. Further, availability of both the emitter and base interconnection leads on the backsides of the cells may further simplify the overall implementation of on-cell electronics for enhanced energy harvesting, as well as additional cell-level monitoring and control functions.

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A back contact solar cell, comprising:
an active semiconductor absorber for use in a back contact solar cell having a light capturing front side and a backside opposite said light capturing front side;
a first interdigitated metallization positioned over said backside of said active semiconductor absorber, said first interdigitated metallization forming base and emitter contact metallization of said back contact solar cell;
a backplane positioned over said backside of said active semiconductor absorber and said first interdigitated metallization;
a second interdigitated metallization positioned over said backplane, said second interdigitated metallization connected to said first interdigitated metallization for extracting photovoltaic power from said active semiconductor absorber, said second interdigitated metallization having base and emitter busbars over said backplane for electrical connection; and
an electronic component electrically connected to at least a base busbar and at least an emitter busbar of said second interdigitated metallization, said electronic component having a bypass switch.

2. The back contact back junction solar cell of claim 1, wherein said electronic component is a Schottky diode.

3. The back contact back junction solar cell of claim 1, wherein said electronic component is a pn junction diode.

4. The back contact back junction solar cell of claim 1, wherein said electronic component is circuitry having a bipolar junction transistor.

5. The back contact back junction solar cell of claim 1, wherein said electronic component is circuitry having a metal-oxide-semiconductor field-effect transistor (MOSFET).

6. The back contact back junction solar cell of claim 1, wherein said second interdigitated metallization is aligned orthogonally to said first interdigitated metallization.

7. The back contact back junction solar cell of claim 1, wherein said electronic component further has a maximum power point tracking power optimizer.

8. The back contact back junction solar cell of claim 7, wherein said maximum power point tracking power optimizer is a DC-to-DC MPPT power optimizer.

9. The back contact back junction solar cell of claim 7, wherein said maximum power point tracking power optimizer is a DC-to-AC MPPT power optimizer.

10. The back contact back junction solar cell of claim 1, wherein said electronic component is a Super Barrier Rectifier (SBR).

11. The back contact back junction solar cell of claim 1, wherein said electronic component is a Cool Bypass Switch (CBS).

12. A solar photovoltaic module, comprising:
a plurality of back contact solar cells, each of said back contact solar cells comprising:
an active semiconductor absorber for use in a back contact solar cell having a light capturing front side and a backside opposite said light capturing front side;
a first interdigitated metallization positioned over said backside of said active semiconductor absorber, said first interdigitated metallization forming base and emitter contact metallization of said back contact solar cell;
a backplane positioned over said backside of said active semiconductor absorber and said first interdigitated metallization;
a second interdigitated metallization positioned over said backplane, said second interdigitated metallization pattern connected to said first interdigitated metallization for extracting photovoltaic power from said active semiconductor absorber, said second interdigitated metallization having base and emitter busbars over said backplane for electrical connection; and
an electronic component electrically connected to at least a base busbar and at least an emitter busbar of said second interdigitated metallization, said electronic component having a bypass switch;
said plurality of back contact solar cells electrically connected within said module.

13. The solar photovoltaic module of claim 12, wherein said electronic component further has a maximum power point tracking power optimizer.

14. The solar photovoltaic module of claim 13, wherein said maximum power point tracking power optimizer is a DC-to-DC MPPT power optimizer.

15. The solar photovoltaic module of claim 13, wherein said maximum power point tracking power optimizer is a DC-to-AC MPPT power optimizer.

16. The solar photovoltaic module of claim 12, wherein said second interdigitated metallization over each of said back contact solar cells is aligned orthogonally to said first interdigitated metallization over each of said back contact solar cells.

17. The solar photovoltaic module of claim 12, wherein said electronic component is circuitry having a metal-oxide-semiconductor field-effect transistor (MOSFET).

18. The solar photovoltaic module of claim 12, wherein said electronic component is a Schottky diode.

19. The solar photovoltaic module of claim 12, wherein said electronic component is a pn junction diode.

20. The solar photovoltaic module of claim 12, wherein said electronic component is circuitry having a bipolar junction transistor.

21. The solar photovoltaic module of claim 12, wherein said electronic component is a Super Barrier Rectifier (SBR).

22. The solar photovoltaic module of claim 12, wherein said electronic component is a Cool Bypass Switch (CBS).

* * * * *